US005703398A

United States Patent [19]
Sono et al.

[11] Patent Number: 5,703,398
[45] Date of Patent: Dec. 30, 1997

[54] SEMICONDUCTOR INTEGRATED CIRCUIT DEVICE AND METHOD OF PRODUCING THE SEMICONDUCTOR INTEGRATED CIRCUIT DEVICE

[75] Inventors: Michio Sono; Kazuto Tsuji; Hideharu Sakoda; Yoshimi Suzuki; Masao Sakuma, all of Kawasaki, Japan

[73] Assignee: Fujitsu Limited, Kawasaki, Japan

[21] Appl. No.: 667,326

[22] Filed: Jun. 20, 1996

Related U.S. Application Data

[63] Continuation of Ser. No. 205,495, Mar. 4, 1994, abandoned.

[30] Foreign Application Priority Data

Mar. 17, 1993 [JP] Japan ................................ 5-057542

[51] Int. Cl.$^6$ ............................ H01L 23/10; H01L 23/34
[52] U.S. Cl. ........................ 257/706; 257/666; 257/676; 257/675
[58] Field of Search ............................ 257/706, 707, 257/718, 719, 720, 722, 796, 675, 676, 666

[56] References Cited

U.S. PATENT DOCUMENTS

| 5,177,669 | 1/1993 | Juskey et al. | 257/675 |
| 5,311,060 | 5/1994 | Rostoker et al. | 257/675 |
| 5,365,107 | 11/1994 | Kuraishi et al. | 257/696 |

FOREIGN PATENT DOCUMENTS

| 3-171651 | 7/1991 | Japan | 257/675 |

*Primary Examiner*—Mahshid D. Saadat
*Assistant Examiner*—S. V. Clark
*Attorney, Agent, or Firm*—Armstrong, Westerman, Hattori, McLeland & Naughton

[57] ABSTRACT

A semiconductor integrated circuit device includes a semiconductor chip supported by a stage, leads electrically connected to the semiconductor chip, first and second heat radiating members provided on first and second sides of the semiconductor chip, and a resin package body completely sealing the semiconductor chip and partially sealing the leads and the first and second heat radiating members.

15 Claims, 25 Drawing Sheets

SEMICONDUCTOR INTEGRATED CIRCUIT DEVICE AND METHOD OF PRODUCING THE SEMICONDUCTOR INTEGRATED CIRCUIT DEVICE

This application is a continuation of application Ser. No. 08/205,495 filed Mar. 4, 1994, now abandoned.

BACKGROUND OF THE INVENTION

1. Field of the Invention

The present invention generally relates to a semiconductor integrated circuit device and a method of producing the same, and more particularly to a semiconductor integrated circuit device having a resin package body and a method of producing the same.

Recently, the amount of energy consumed in a semiconductor chip and the amount of heat generated thereby has increased together with an improvement in the integration density. Particularly, a high-speed MPU (Micro-Processor Unit) consumes a large amount of energy and generates a large amount of heat. Hence, it is required that a semiconductor integrated circuit device having a resin package body sealing a semiconductor chip consuming a large amount of energy, such as an MPU, has a structure having good heat radiating performance.

A description will now be given, with reference to FIG. 1, of a conventional semiconductor integrated circuit device 10. The device 10 includes a semiconductor chip 11 mounted on a stage 12, and a plurality of leads 13. Each of the leads 13 includes an inner lead portion 13a and an outer lead portion 13b. Wires 14 connect the inner lead portions 13a of the leads 13 and the semiconductor chip 11. A resin package body 15 seals the semiconductor chip 11. A heat radiating plate 16 made of copper or aluminum is embedded in an upper surface portion of the resin package body 15. Heat generated by the semiconductor chip 11 conducts in the resin package body 15 and reaches the heat radiating plate 16. Then, the heat rapidly conducts the entire heat radiating plate 16, and is radiated from the entire upper surface of the plate 16.

However, the conventional semiconductor integrated circuit device 10 shown in FIG. 1 has a disadvantage due to the structure in which the heat radiating plate 16 is provided for only the upper surface side of the resin package body 15. When the semiconductor chip 11 generates a large amount of heat, the heat radiating plate 16 cannot radiate the heat effectively, and hence the heat radiating performance of the semiconductor device 10 is degraded.

It may be possible to replace the resin package body 15 by a ceramic package body in order to enhance the heat radiating performance. However, the production cost of a device using the ceramic package body is as high as five to ten times the production cost for producing a device having the resin package body.

SUMMARY OF THE INVENTION

It is a general object of the present invention to provide a semiconductor integrated circuit device and a method of producing the same in which the above disadvantages are eliminated.

A more specific object of the present invention is to provide a semiconductor integrated circuit device and a method of producing the same having an improved heat radiating performance.

The above objects of the present invention are achieved by a semiconductor integrated circuit device comprising a semiconductor chip supported by a stage; leads electrically connected to the semiconductor chip; first and second heat radiating members provided on first and second sides of the semiconductor chip; and a resin package body completely sealing the semiconductor chip and partially sealing the leads and the first and second heat radiating members.

The above objects of the present invention are also achieved by a method of producing a semiconductor integrated circuit device comprising the steps of:

(a) forming a first assembly having a semiconductor chip mounted on a stage of a lead frame and wires connecting the semiconductor chip to leads;

(b) forming a second assembly including first and second heat radiating members and a supporting frame supporting the first and second heat radiating members;

(c) combining the first assembly and the second assembly together so that the first and second heat radiating members are located on first and second sides of the semiconductor chip;

(d) forming a resin package body by molding so that the semiconductor chip is completely molded and the leads and the first and second heat radiating members are partially sealed;

(e) removing a portion of the supporting frame outside of the resin package body; and (f) cutting the lead frame and bending the leads.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given of a first embodiment of the present invention.

Figure 2:
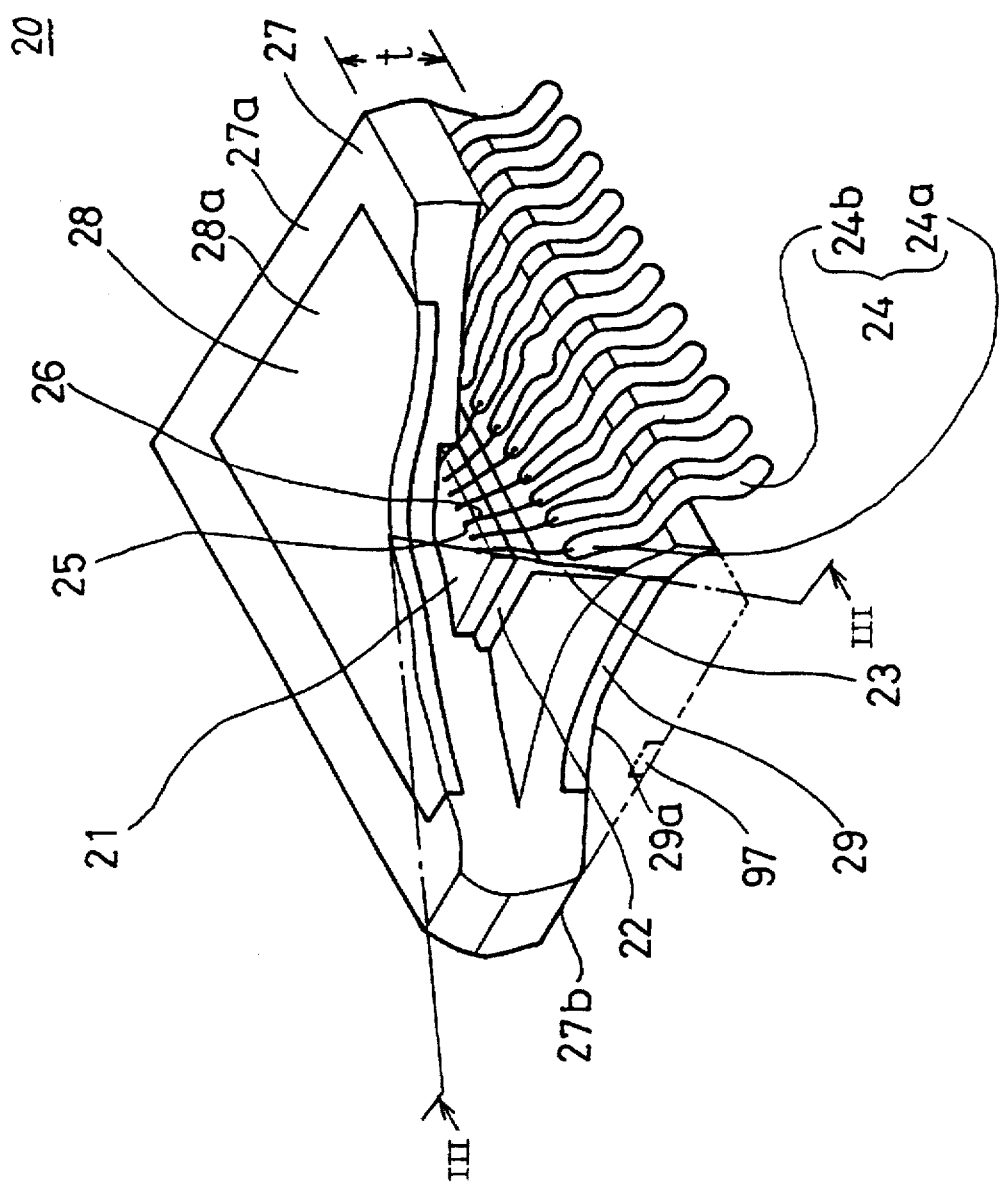
FIG. 2 is a partially cutaway perspective view of a semiconductor integrated circuit device according to an embodiment of the present invention.
Figure 3:
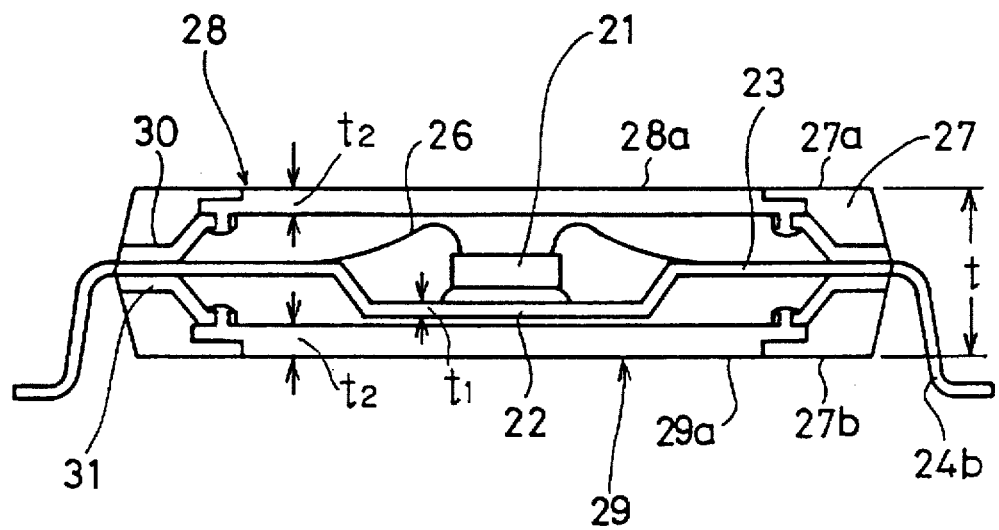
FIG. 3 is a cross-sectional view taken along a line III—III shown in FIG. 2.

FIG. 2 is a partially cutaway perspective view of a semiconductor integrated circuit device 20 according to a first embodiment of the present invention. FIG. 3 is a cross-sectional view taken along line III—III shown in FIG. 2.

The device 20 includes a semiconductor chip 21, which is, for example, an MPU. The semiconductor chip 21 is mounted on a stage 22 and adheres to the stage 22 by silver paste (that is, a silver paste layer is interposed between the chip 21 and the stage 22). The stage 22 is supported by supporting bars 23. The device 20 includes a plurality of leads 24, each of which includes an inner lead portion 24a and an outer lead portion 24b. A plurality of pads 25 are mounted on the semiconductor chip 21, and are connected to the inner lead parts 24a by wires 26. A resin package body 27 seals the semiconductor chip 21, the stage 22 and the inner lead portions 24a of the leads. The thickness t of the resin package body 27 is, for example, a standardized value.

An upper heat radiating plate 28 is embedded in an upper surface portion of the resin package body 27. A lower radiating plate 29 is embedded in a lower surface of the resin package body 27. The upper heat radiating plate 28 is made of, for example, copper or aluminum, and has a size smaller than that of the resin package body 27. The upper heat radiating plate 28 occupies most of the entire upper surface 27a of the resin package body 27. It is preferable that the thickness t2 of the upper heat radiating plate 28 is greater than the thickness t1 of the stage 22 in order to facilitate the heat radiating performance. However, the thickness t2 may be equal to or less than the thickness t1. An upper surface 28a of the upper heat radiating plate 28 is leveled to the upper surface 27a of the resin package body 27.

The lower heat radiating plate 29 of, for example, copper or aluminum, and has a size than that of the resin package body 27. The lower heat radiating plate 29 occupies most of the entire lower surface 27b of the resin package body 27. It is preferable that the thickness t2 of the lower heat radiating plate 29 is greater than the thickness t1 of the stage 22 in order to facilitate the heat radiating performance. However, the thickness t2 may be equal to or less than the thickness t1. A lower surface 29a of the lower heat radiating plate 29 is leveled to the lower surface 27b of the resin package body 27.

Upper supporting bars 30 support the upper heat radiating plate 28. Lower supporting bars 31 support the lower heat radiating plate 29. Each of the upper supporting bars 30 has one end which is in contact with a corner part of a lead frame 60, and the other end extending to one side of the corresponding supporting bar 23. Each of the lower supporting bars 30 has one end which is in contact with a corner part of the lead frame 60, and the other end extending to the other side of the corresponding supporting bar 23. The supporting bar 23 is sandwiched between the related upper supporting bar 30 and lower supporting bar 31.

The supporting bars 30 and 31 support the heat radiating plates 28 and 29 at the time of resin molding, and further function as anchors which prevent the heat radiating plates 28 and 29 from be broken away from the resin package body 27 after molding.

Figure 4:
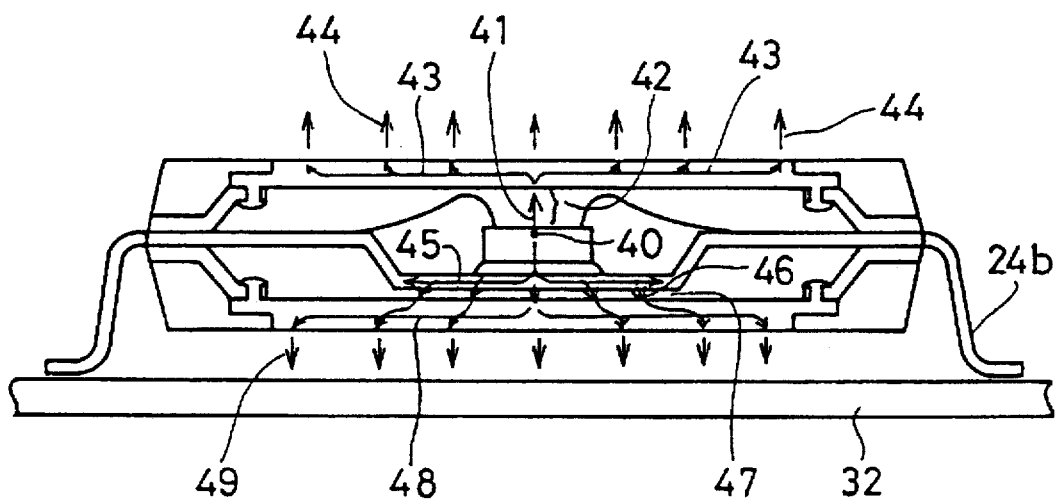
FIG. 4 is a cross-sectional view showing the heat radiating mechanism in the embodiment of the present invention shown in FIGS. 2 and 3.

A description will now be given, with reference to FIG. 4, of the heat radiating performance of the semiconductor device 20. The semiconductor device 20 is mounted on a printed-circuit board 32 in a state in which the outer lead portions 24b are attached to the printed-circuit board 32 by soldering.

When the semiconductor chip 21 operates, it generates heat. The heat generated by the chip 21 is radiated via the upper heat radiating plate 28 and the lower heat radiating plate 29.

A consideration will now be given to heat generated at the center 40 of the upper surface of the semiconductor chip 21. As indicated by an arrow 41 shown in FIG. 4, almost half the heat generated at the center 40 of the upper surface of the chip 21 conducts a resin portion 42 filling a space between the chip 21 and the upper heat radiating plate 28. When the above heat reaches the upper heat radiating plate 28, the conduction of the heat is rapidly spread within the upper heat radiating plate 28, as indicated by an arrow 43. Then, as indicated by an arrow 44, the heat is externally radiated from almost the entire upper surface 28a of the upper heat radiating plate 28.

The remaining of the heat generated at the center 40 of the semiconductor chip 21 conducts in the chip 21 and the silver paste layer, and reaches the stage 22. Then, as indicated by an arrow 45, the heat is spread within the stage 22. Subsequently, as indicated by an arrow 46, the heat conducts a resin portion 47 filling a space between the stage 22 and the lower heat radiating plate 29. When the heat reaches the lower heat radiating plate 29, as indicated by an arrow 48 shown in FIG. 4, conduction of the heat is rapidly spread in the lower heat radiating plate 29. Then, as indicated by an arrow 49, the heat is externally radiated to the space on the printed-circuit board 32 from almost the entire lower surface 29a of the plate 29.

Heat generated at other portions is radiated via the upper heat radiating plate 28 and the lower heat radiating plate 29 in the same manner as described above.

Figure 1:
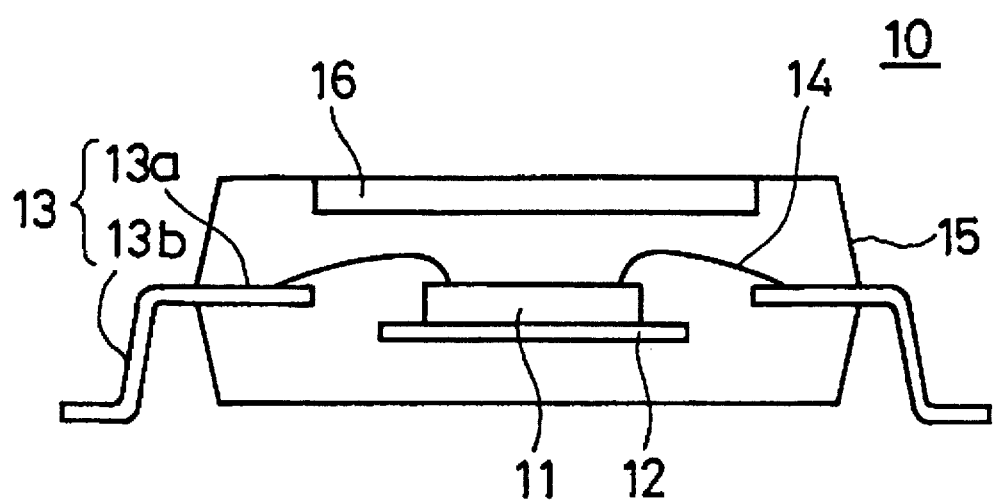
FIG. 1 is a diagram of a conventional semiconductor integrated circuit device.

According to the present invention, heat generated in the semiconductor device is externally radiated from almost the entire upper surface 28a of the upper heat radiating plate 28 and from almost the entire lower surface 29a of the lower heat radiating plate 29. Hence, the semiconductor device according to the first embodiment of the present has a heat radiating performance better than that of the conventional device 30 shown in FIG. 1.

Figure 5:
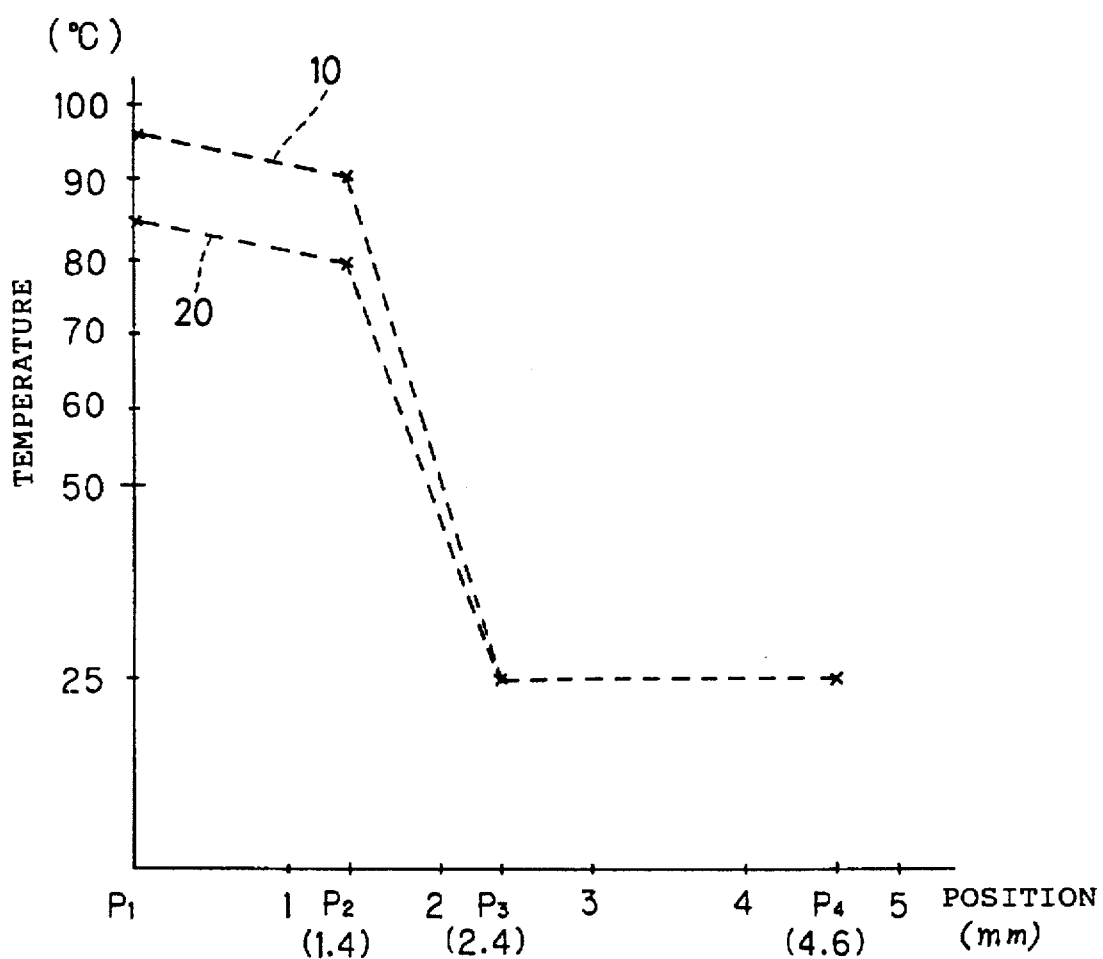
FIG. 5 is a graph of heat radiating performances of the semiconductor devices shown in FIGS. 1 and 2.

FIG. 5 is a graph of heat radiating performance of the semiconductor devices 10 and 20 obtained by a measurement conducted by the inventors. In the measurement, the semiconductor devices 10 and 20 were operated in the ordinary state. In FIG. 5, symbol P1 denotes the position of the semiconductor chips 11 (FIG. 1) and 21 (FIGS. 2 and 3). Symbol P2 denotes the position of the center on the upper surface 28a of the upper heat radiating plate 28 and is 1.4 mm away from the position P1. The symbol P2 also denotes the center of the heat radiating plate 16. Symbol P3 denotes a arbitrary position, which is 2.4 mm away from the position P1. Symbol P4 denotes a room-temperature measuring position, which is 4.6 mm away from the position P1.

The graph shows that the temperatures of the positions P1, P2, P3 and P4 for the semiconductor device 20 according to the first embodiment of the present invention are 85° C., 80° C., 25° C. and 25° C., respectively. Further, the graph shows that the temperatures of the positions P1, P2, P3 and P4 for the conventional semiconductor device 10 are 96° C., 91° C., 25° C. and 25° C., respectively. That is, the semiconductor chip 21 of the device 20 is 11° C. lower than the semiconductor chip 11 of the conventional device 10. This shows that the heat radiating performance of the semiconductor device 20 is superior to that of the conventional semiconductor device 10. As a result, it becomes possible to provide a semiconductor device having a high-speed, high-power-consumption chip like an MPU sealed by a resin package body. It will be noted that only a ceramic package body can seal such a high-speed, high-power-consumption chip in the prior art.

Figure 6:
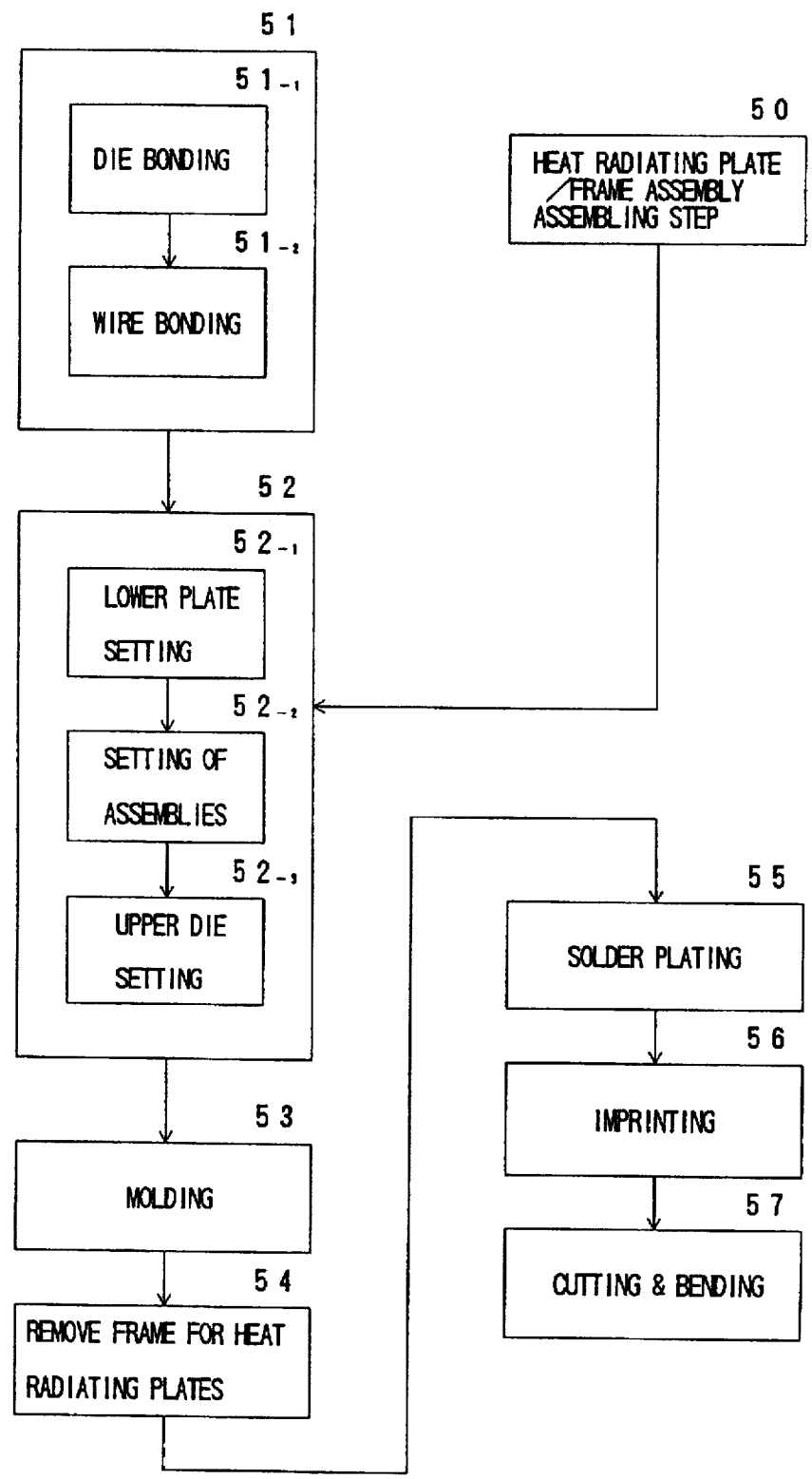
FIG. 6 is a flowchart of a process of producing the semiconductor device according to the embodiment of the present invention.

A description will now be given of a method of producing the semiconductor integrated circuit device 20 according to the first embodiment of the present invention. The production process is outlined in FIG. 6. As shown in FIG. 6, the production method includes step 50 of assembling a heat radiating plate/frame assembly. This step can be performed in parallel with step 51 of assembling a semiconductor chip/lead frame assembly. Then, the semiconductor chip/lead frame assembly and the heat radiating plate/frame assembly are incorporated together, and are set in a die and are then molded. Then, the incorporated assembly is taken out of the die and plated by soldering. Thereafter, imprinting is performed and the leads are cut and bent.

Figure 7A:
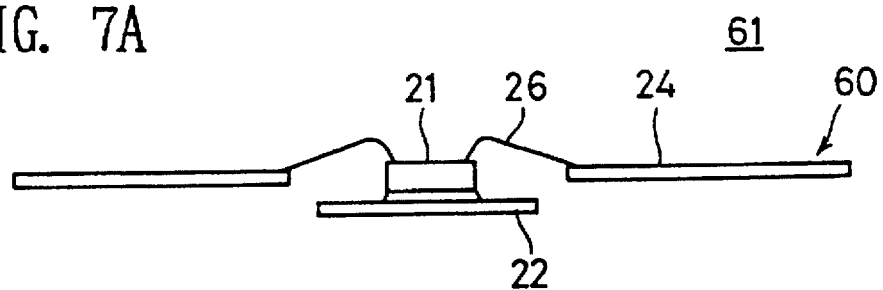
FIGS. 7A and 7B are side views of a semiconductor chip/lead frame assembly.
Figure 7B:
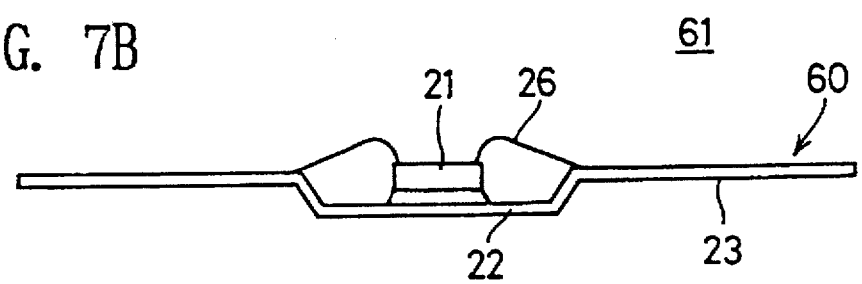

A description will now be given of step 51 of assembling the semiconductor chip/lead frame assembly. As shown in FIG. 6, the step 51 includes die bonding step 51-1 and wire bonding step 51-2. The steps 51-1 and 51-2 are shown in FIGS. 7A and 7B in detail. The semiconductor chip 21 is made to adhere to the stage 22 of the lead frame 60 made of, for example, 42 w % Ni-Fe by the die bonding step 51-1. Then, the wires 26 are bonded by the wire bonding step 51-2. In FIGS. 7A and 7B, reference number 61 indicates the semiconductor chip/lead frame assembly. The stage 22 and the supporting bars 23 are parts of the lead frame 60, and are hence integrally formed.

Figure 8:
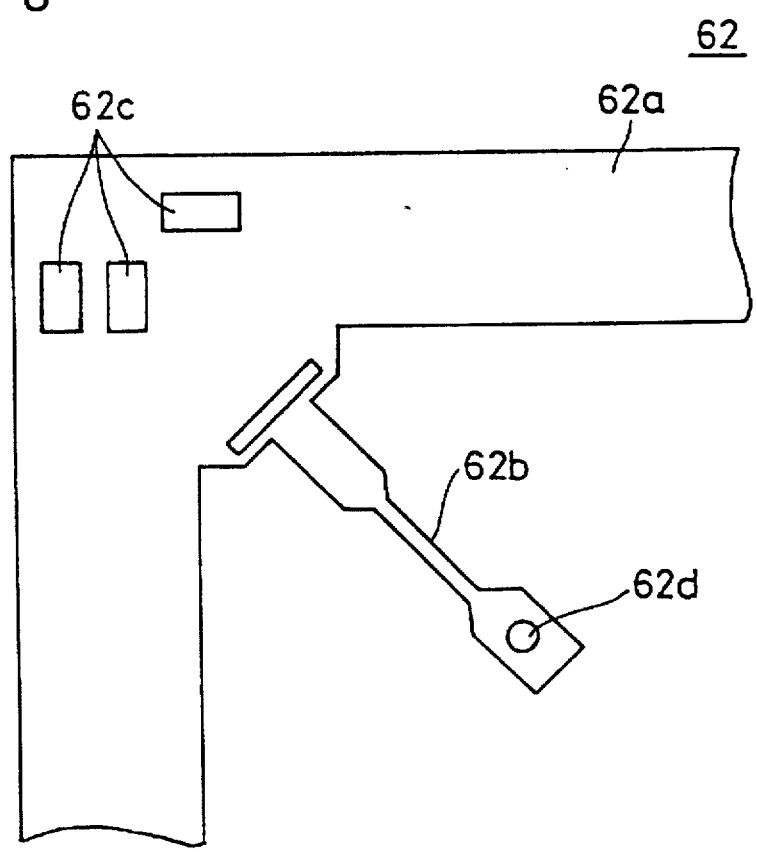
FIG. 8 is a plan view of a part of a frame used to form a heat radiating plate.
Figure 9:
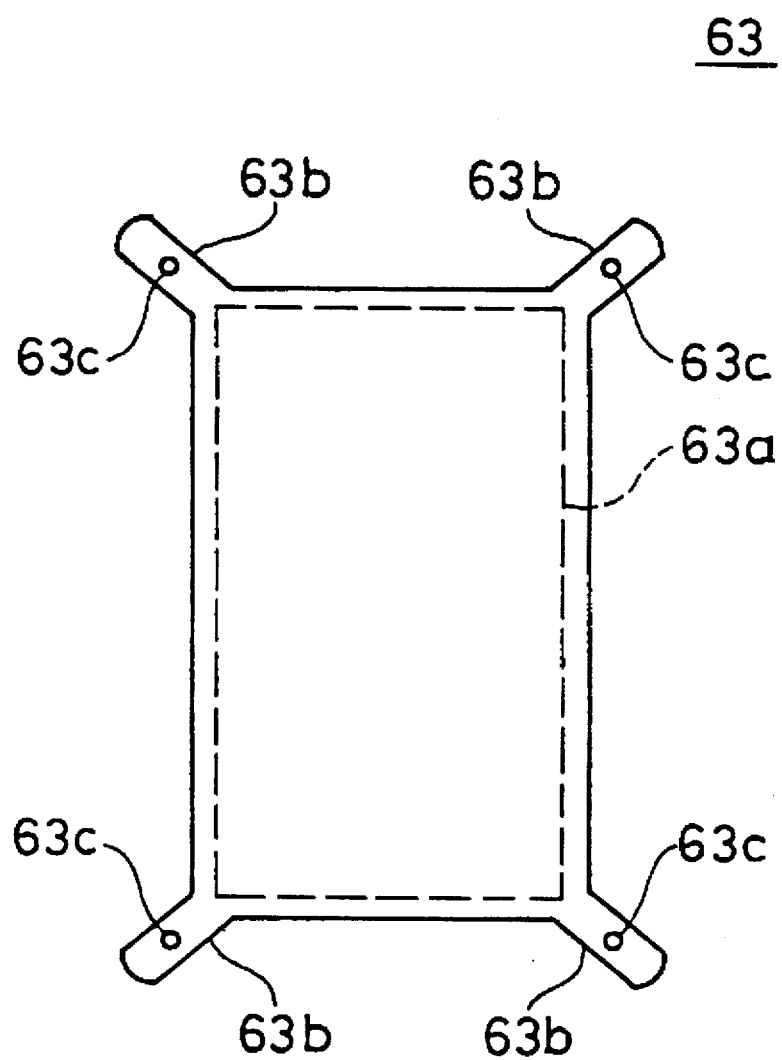
FIG. 9 is a plan view of a heat radiating plate.

Step 50 of assembling the heat radiating plate/frame assembly is independently performed in parallel with step 51. In step 50, a heat radiating plate 63 (28, 29) shown in FIG. 9 is fixed to a frame 62 for a heat radiating plate shown in FIG. 8. The frame 62 is made of, for example, copper, and includes a frame portion 62a and supporting bars 62b (30, 31) extending from the frame portion 62a, as shown in FIG. 8. Only one of the supporting bars 62b is illustrated in FIG. 8. A plurality of holes 62c for use in locating are formed in the frame portion 62a. The heat radiating plate 63 includes a copper plate plated with nickel. As shown in FIG. 9, a step portion 63a is formed in the entire periphery of the heat radiating plate 63, which has arm portions 63b extending from the four corner portions of the heat radiating plate 63. Projections 63c for caulking are formed on the corner portions of the heat radiating plate 63.

Figure 10:
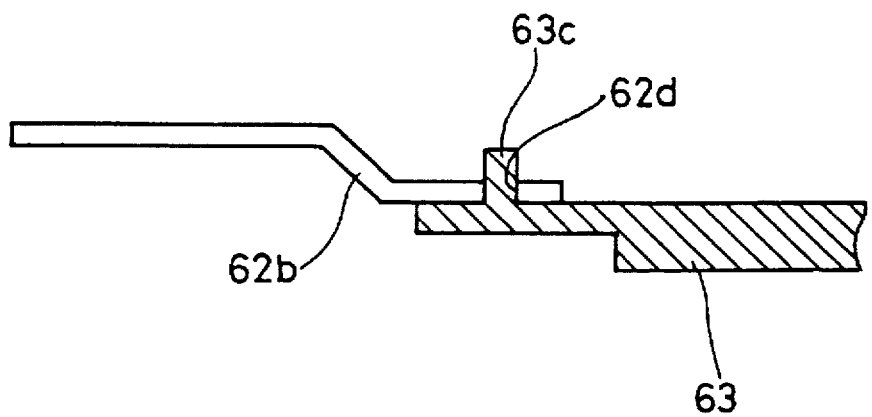
FIG. 10 is a cross-sectional view showing a connection of the heat radiating plate and the frame shown in FIG. 8.
Figure 12:
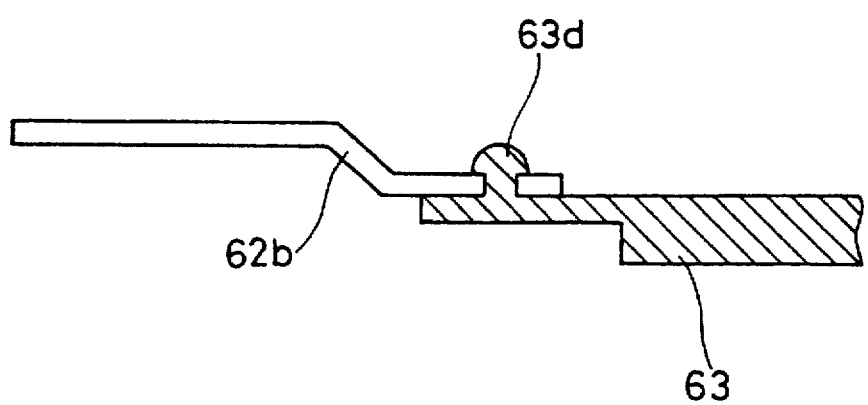
FIG. 12 is a cross-sectional view taken along a line XII—XII shown in FIG. 11.
Figure 11:
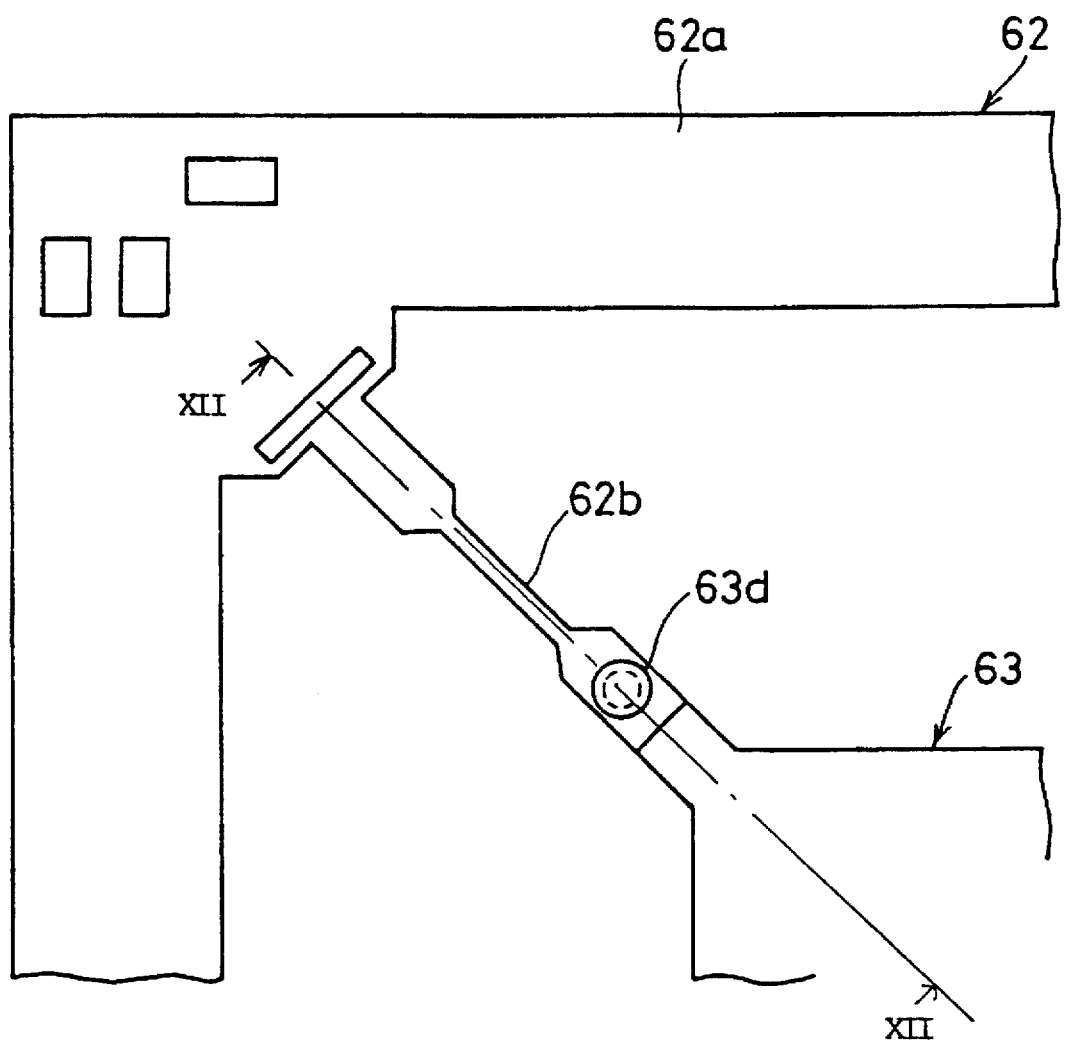
FIG. 11 is a plan view of a heat radiating plate/frame assembly.

As shown in FIG. 10, the projections 63c are engaged with holes 62d (also shown in FIG. 8) formed in end portions of the supporting bars 62b. Then, as shown in FIGS. 11 and 12, the projections 63c are crushed so that crushed portions (calk portions) 63d fix the heat radiating plate 63 to the supporting bars 62b of the frame 62. In this manner, the heat radiating plate/frame assembly indicated by reference number 64 is assembled as shown in FIGS. 11 and 12.

The assembly step 51 can be performed separately from the assembly step 50, and does not influence the assembly step 50. Instead of the crushed portions 63d, it can be possible to use an organic adhesive, soldering or glass in order to fix the heat radiating plate 63 to the frame 62.

A setting step 52 shown in FIG. 6 will be described below. As shown in FIG. 6, the setting step 52 includes a lower plate setting step 52-1, an assembly setting step 52-2, and an upper die setting step 52-3.

Figure 13:
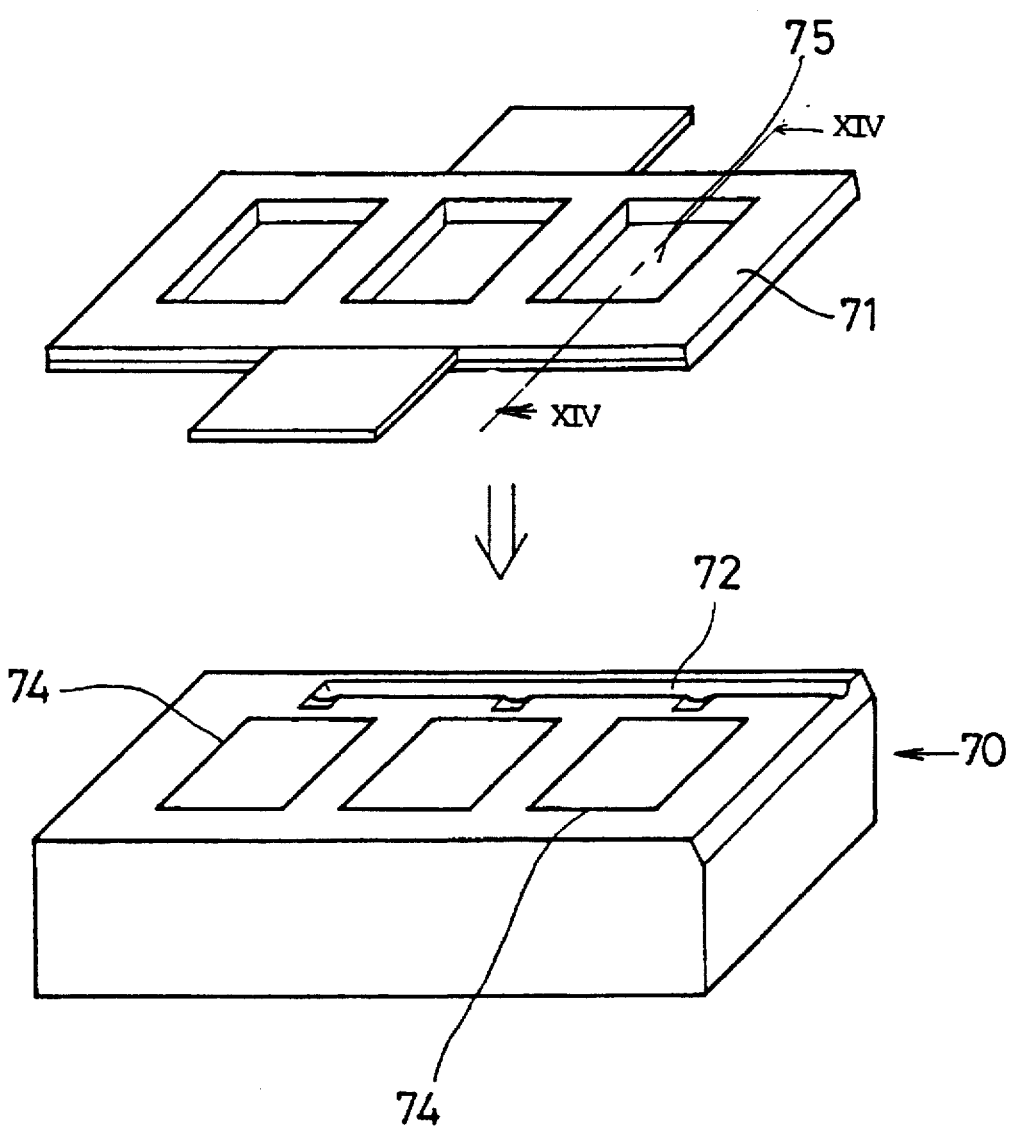
FIG. 13 is a perspective view of a step of setting a lower plate to a lower die.

In the lower plate setting step 52-1, as shown in FIG. 13, a lower plate 71 is mounted on the upper surface of a lower die 70. The structure in which the lower plate 71 is separated from the lower die 70 is employed due to the following reason. The assemblies 61 and 64 are superposed, and hence it is very difficult to form a gate at the time of resin molding at the supporting bars. With the above in mind, a gate is defined at a corner portion related to the lower surface and the side surface of the resin package. In this case, when the lower plate 71 is separated from the lower die 70, the resin package body can be easily taken out of the die after molding.

Figure 14:
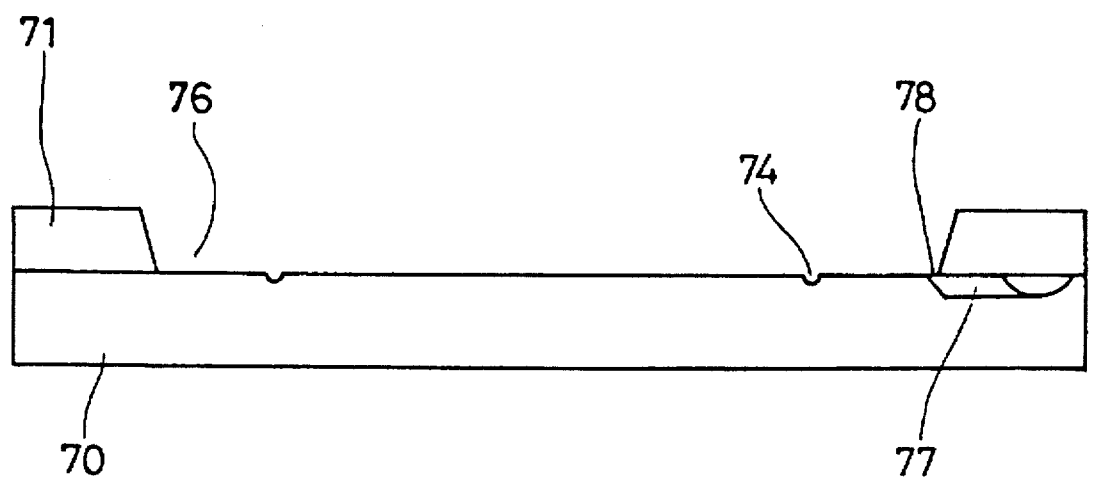
FIG. 14 is a cross-sectional view taken along a line XIV—XIV shown in FIG. 13.

A runner groove 72 and grooves 74 each shaped into a rectangular closed loop and preventing unwanted flow of resin. Further, rectangular openings 75 are formed in the lower plate 71, as shown in FIG. 13. In the lower plate 71 is placed in position, the lower plate 71 is mounted on the lower die 70, as shown in FIG. 14. As shown in FIG. 14, a cavity is formed, and a runner 77 is formed in which the groove 72 is covered by the lower plate 71. An end of the groove 72 is exposed so that a gate 78 is formed.

Figure 15:
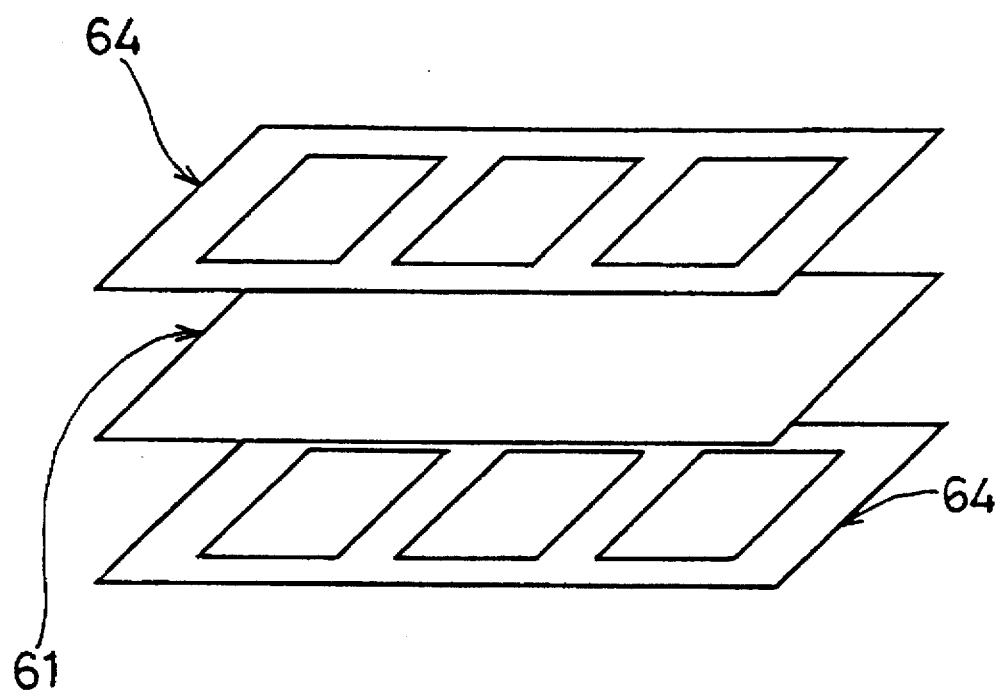
FIG. 15 is a perspective view of a step of setting the assemblies to the lower die.
Figure 15:
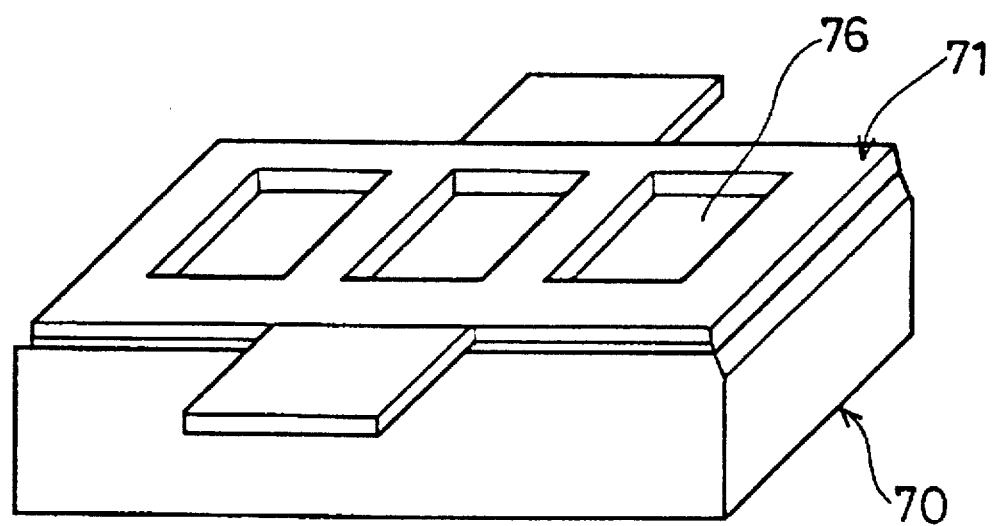
Figure 16:
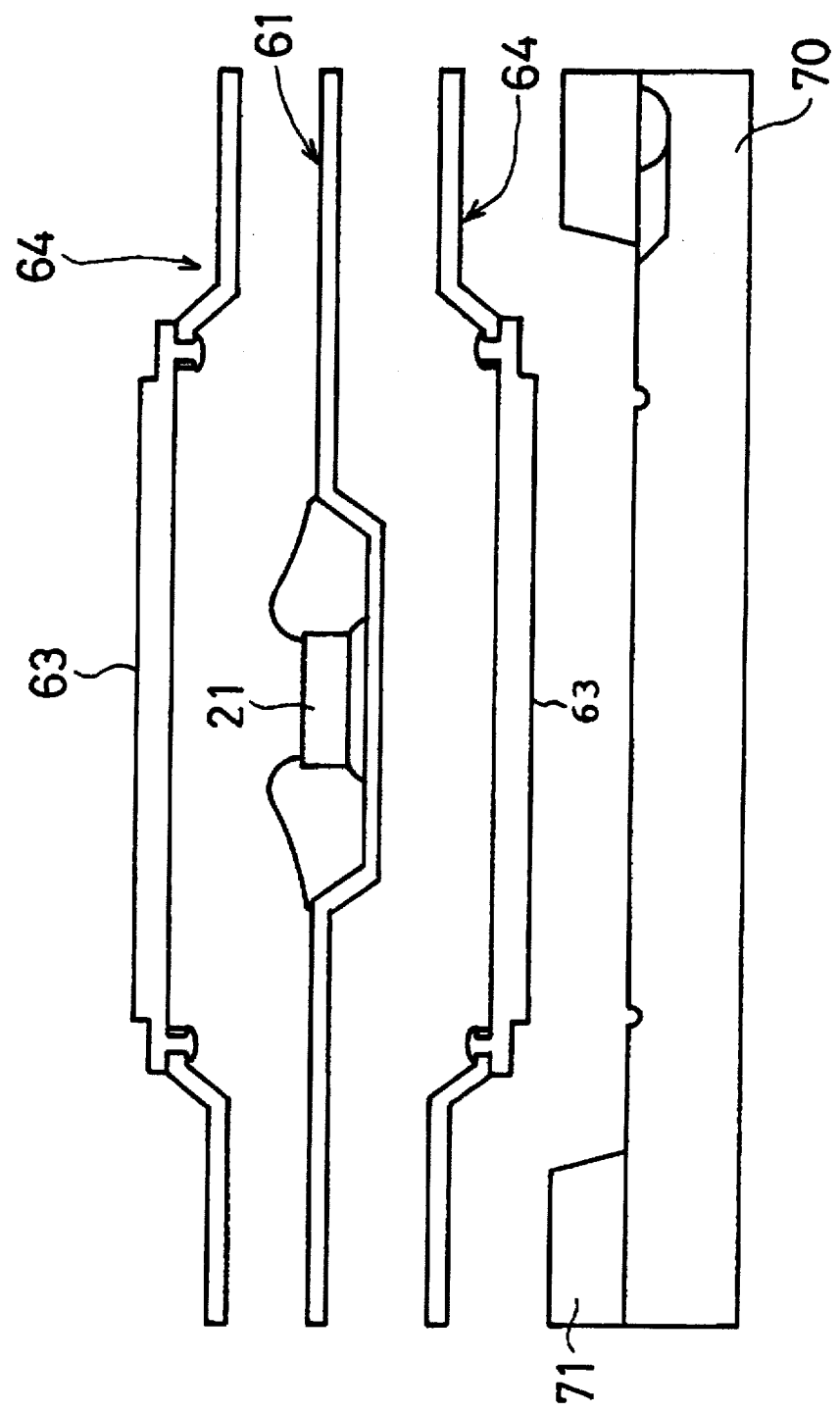
FIG. 16 is a side view of the step of setting the assembles to the lower die.

Then, the assembly setting step 52-2 is performed. In the step 52-2, as shown in FIGS. 15 and 16, one heat radiating plate/frame assembly 64 is placed on the lower die 70 to which the lower plate 71 is set in such a manner that the projecting portion of the heat radiating plate 63 faces downwards. Then the semiconductor chip/lead frame assembly 71 is placed on the assembly 64. Thereafter, another heat radiating plate/frame assembly 64 is placed on the assembly 61 in such a manner that the projecting portion of the heat radiating plate 63 faces upwards.

Figure 17:
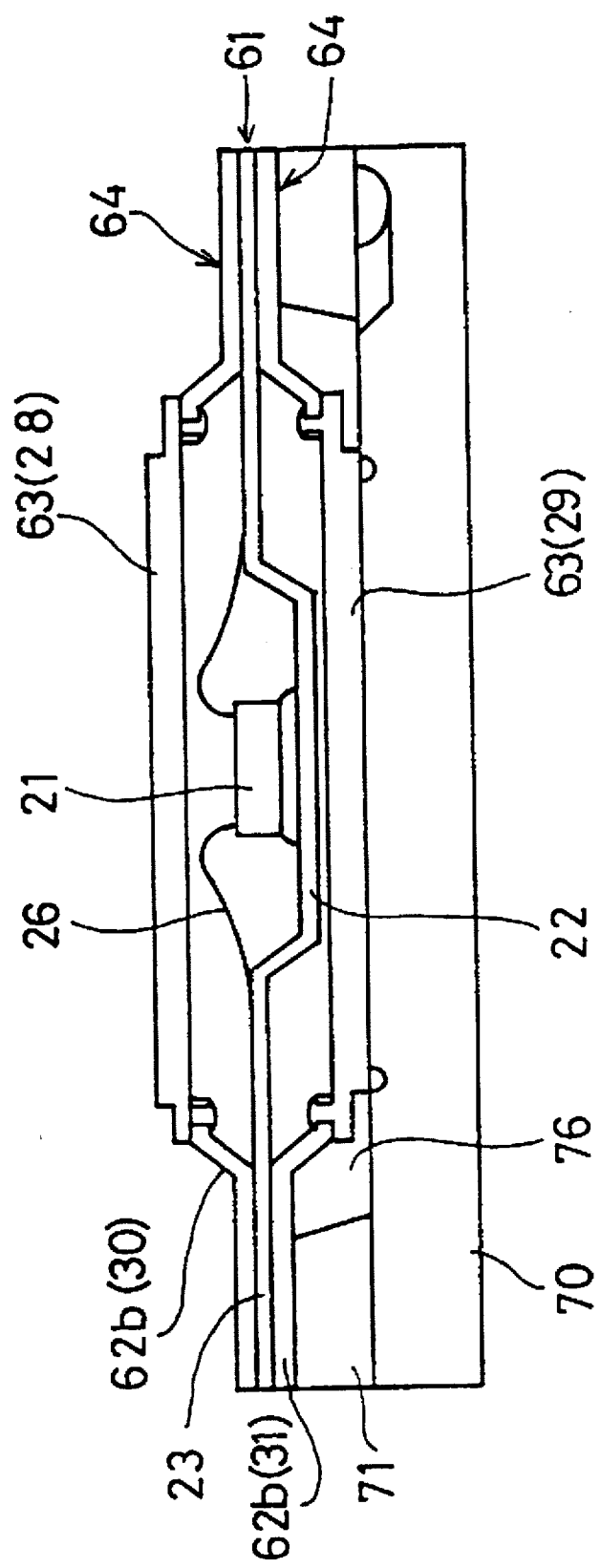
FIG. 17 is a side view of an assembly after the setting step shown in FIGS. 15 and 16 is completed.
Figure 18:
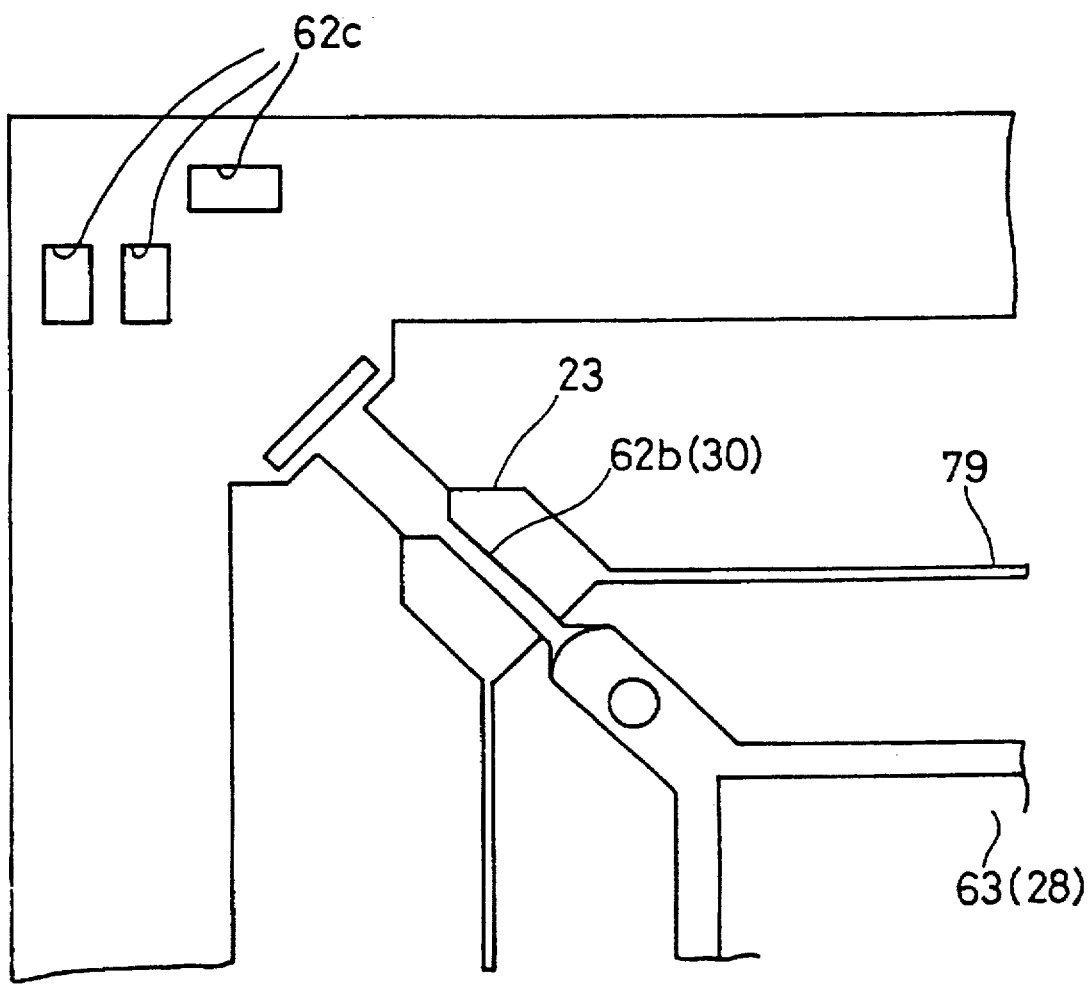
FIG. 18 is a plan view of the assembly shown in FIG. 17.

Then, as shown in FIG. 18, the assemblies 64, 61 and 64 are located by utilizing the holes 62c formed in the frames 62 of the assemblies 64. As shown in FIGS. 17 and 18, the assemblies 64, 61 and 64 are joined together so that the stage 22 is not in contact with the heat radiating plate 63 (29) but spaced apart therefrom and that the wires 26 are not in contact with the heat radiating plate 63 (28) but spaced apart therefrom. Further, the supporting bars 23 of the assembly 61 and the supporting bars 62b (30, 31) are stacked. Furthermore, the heat radiating plate 63 (29) is accommodated in the cavity 76, and the heat radiating plate 63 (28) upwards projects from the cavity 76. Further, the stage 22, the semiconductor chip 21 and the wires 26 are accommodated in a space defined by the heat radiating plate 63 (28) and the heat radiating plate 63 (29).

A tie bar 79 shown in FIG. 18 is a part of the lead frame 60, and functions as a resin stopper in a molding step which will be described later.

Figure 19:
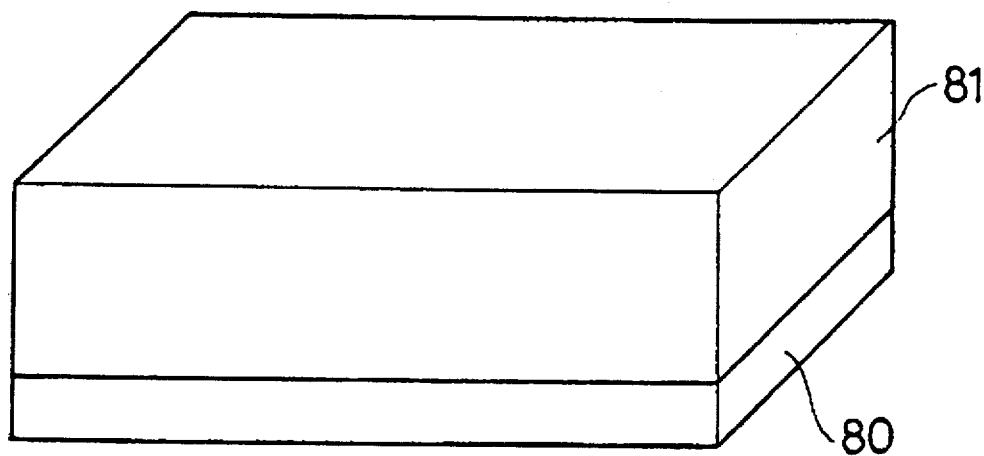
FIG. 19 is a perspective view of an upper die setting step.
Figure 19:
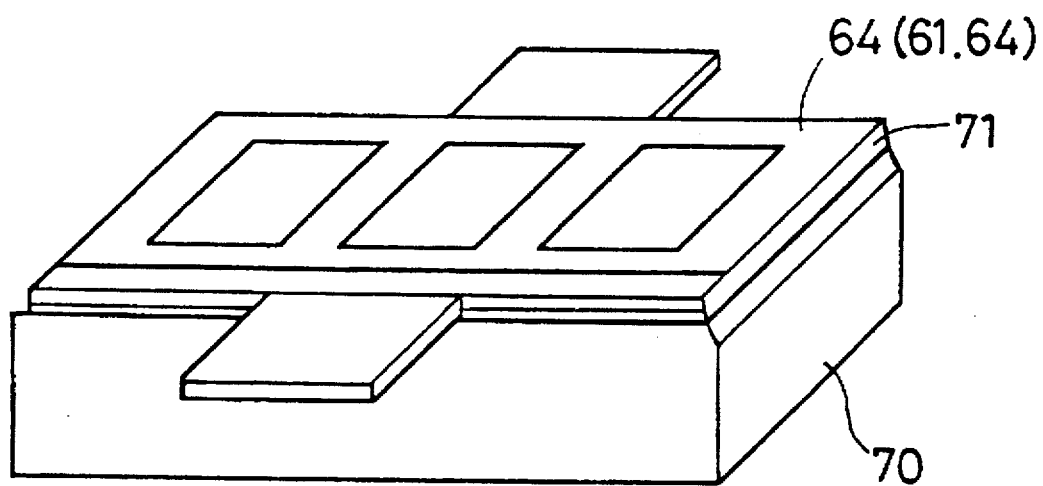
Figure 20:
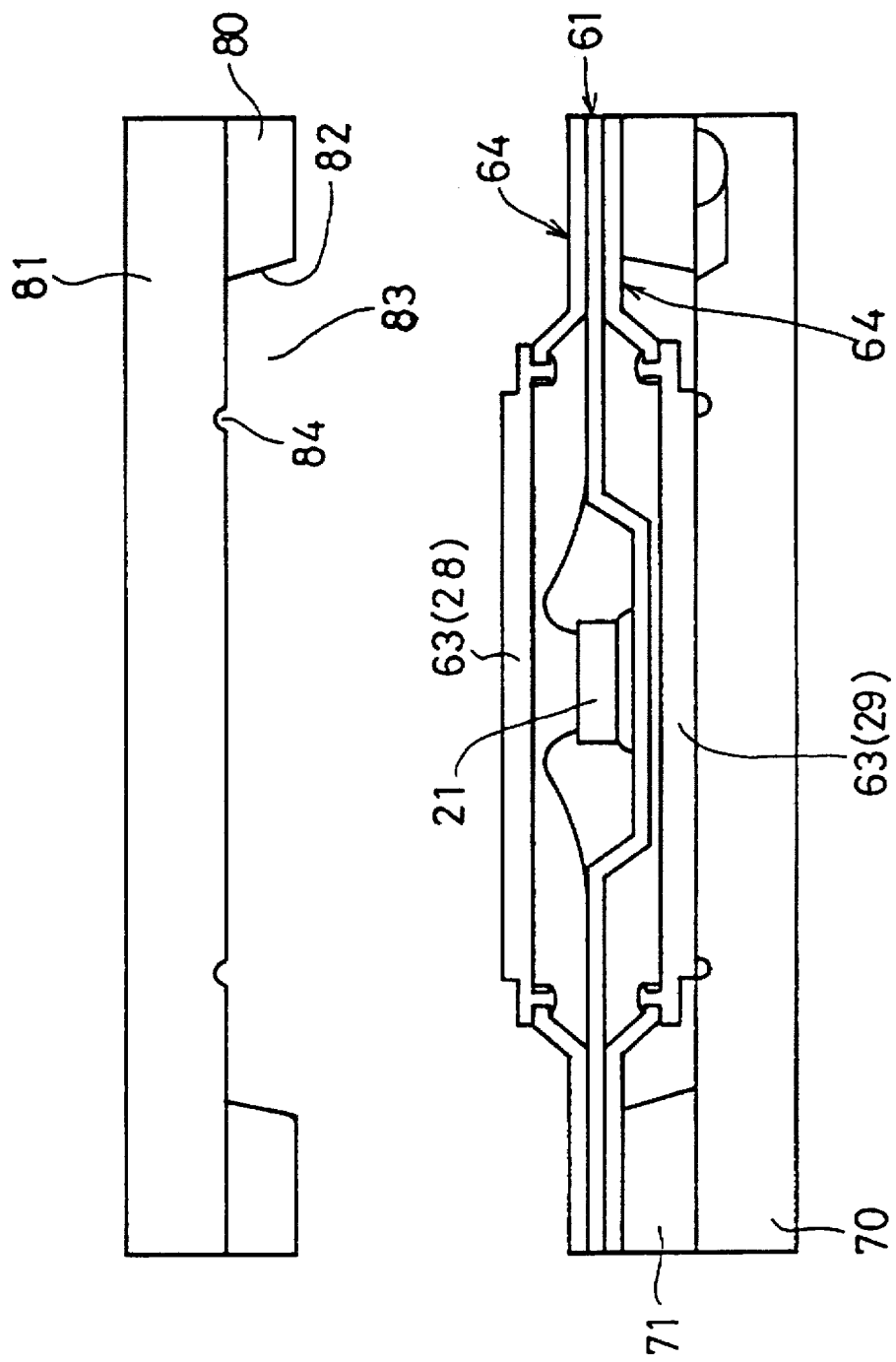
FIG. 20 is a side view of the upper die setting step shown in FIG. 19.
Figure 21:
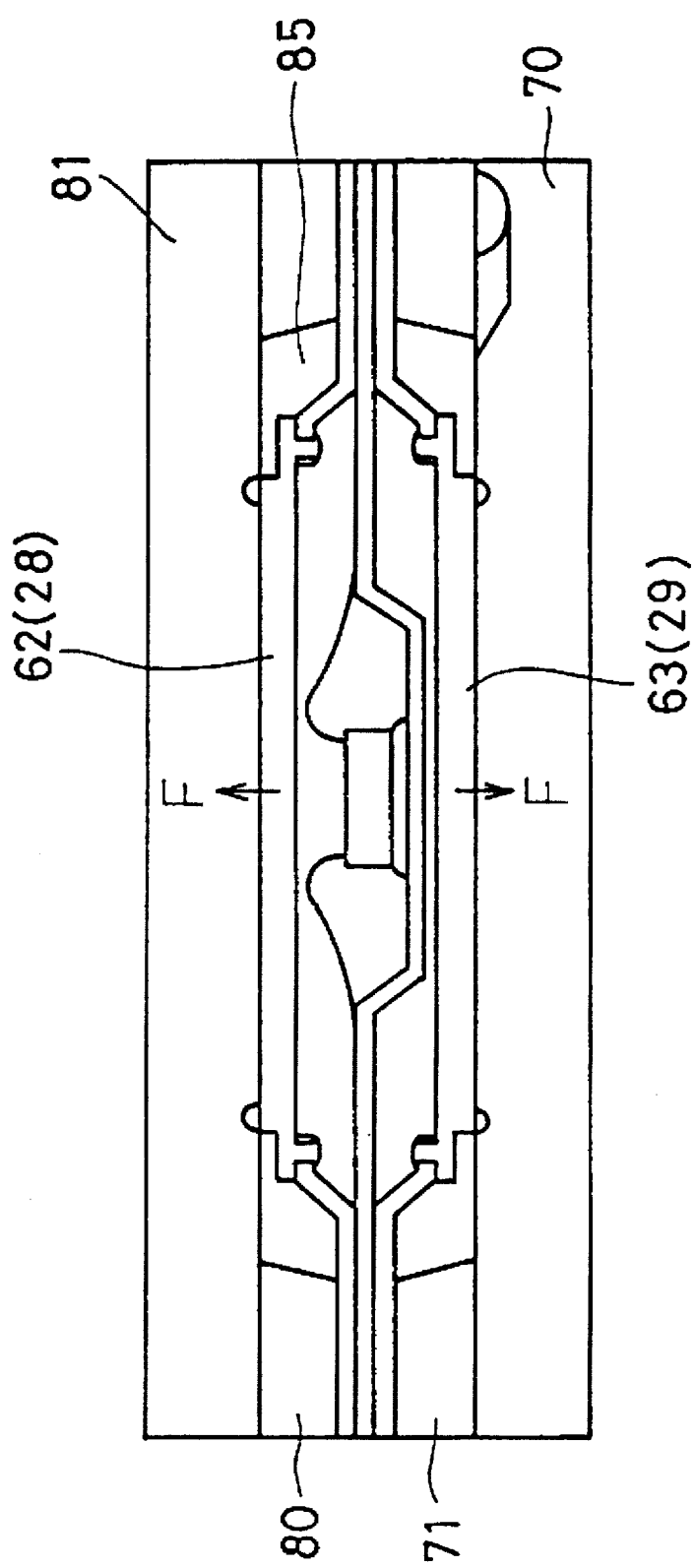
FIG. 21 is a side view of an assembly after the step shown in FIGS. 19 and 20 is completed.

Then, the upper die setting step 52-3 is performed. In the upper die setting step 52-3, as shown in FIGS. 19, 20 and 21, an upper die 81 having a lower surface to which an upper plate 80 is attached is placed on the lower die 70. The upper plate 80 has almost the same shape as the lower plate 71, and has a rectangular opening 82 as shown in FIG. 20. The rectangular opening 82 defines a cavity 83. A groove 84 for preventing unwanted flow of resin is formed in the upper die 81. When the upper die 81 is placed in position, as shown in FIG. 21, the frames of the assemblies 64, 61 and 64 are clamped between the lower plate 71 and the upper plate 80. Further, a cavity 85 is formed by the cavities 76 and 83 superposed. Furthermore, the heat radiating plate 63 (29), the stage 22, the semiconductor chip 21 and the heat radiating plate 63 (28) are accommodated in the cavity 85. Moreover, the supporting bars 62b are slightly deformed elastically. Elastic force charged in the supporting bars 62b pushes the heat radiating plate 63 (29) against the lower die 71 with force F (FIG. 21), and pushes the heat radiating plate 63 (28) against the lower die 70 with force F.

Figure 22:
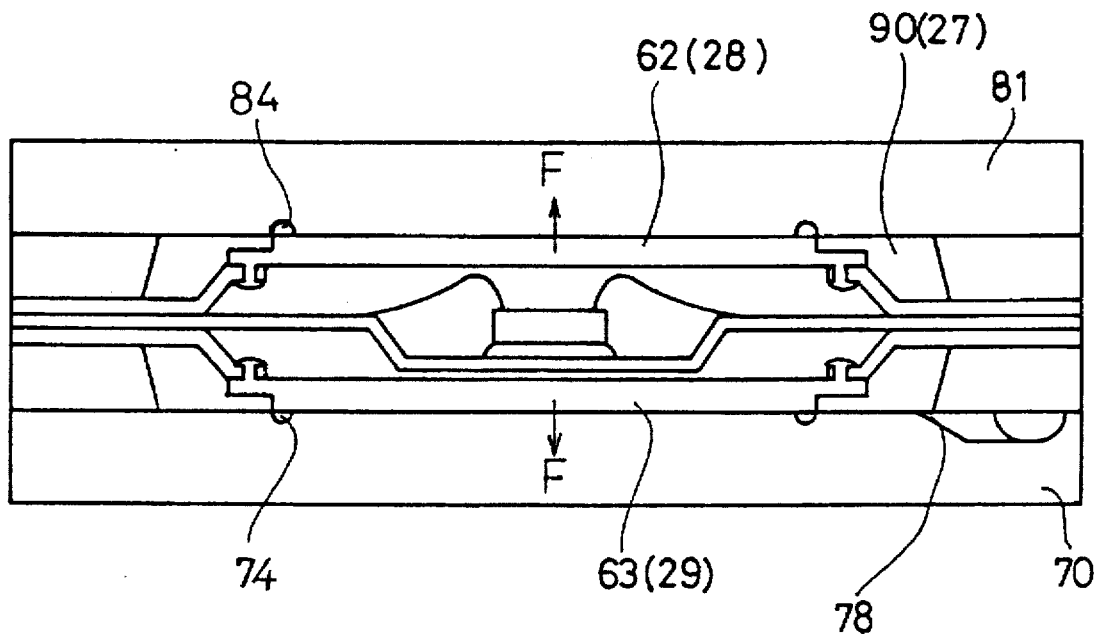
FIG. 22 is a side view of a molding step.

A molding step 53 shown in FIG. 6 is performed as follows. The upper die 81 is placed in position and kept in this state for 30 seconds to one minutes in order to set the temperatures of the heat radiating plates 63 (28 and 29) approximately equal to those of the dies 81 and 70. Thereafter, epoxy resin is introduced into the cavity 85 from the gate 78 (FIG. 14) via the runner 77 (FIG. 14). FIG. 22 shows a state of the overall assembly observed after the molding step 53 is completed. In FIG. 22, the cavity 85 is filled with resin 90, which forms the resin package body 27. In the resin 90, there are embedded the stage 22, the semiconductor chip 21, the wires 26, the inner leads (not shown in FIG. 22), the supporting bars 62b (30, 31), and the step portions 63a of the heat radiating plates 63 (28, 29).

Due to the following reasons, resin is prevented from entering between the heat radiating plate 63 (29) and the lower die 70 and between the heat radiating plate 63 (28) and the upper die 81. If resin enters between those parts, a burr of resin will be formed. The first reason is such that the heat radiating plates 63 (28, 29) are pushed against the upper die 81 and the lower die 70. The second reason is such that the grooves 74 and 84 preventing entry of resin are formed in the peripheral portions of the heat radiating plates 63 (28 and 29).

Figure 24:
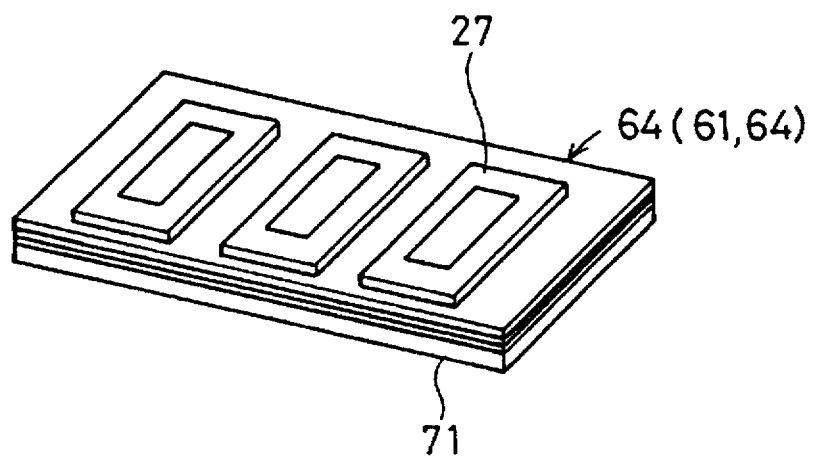
FIG. 24 is a perspective view of the molded assembly after the detaching step shown in FIG. 23.
Figure 23:
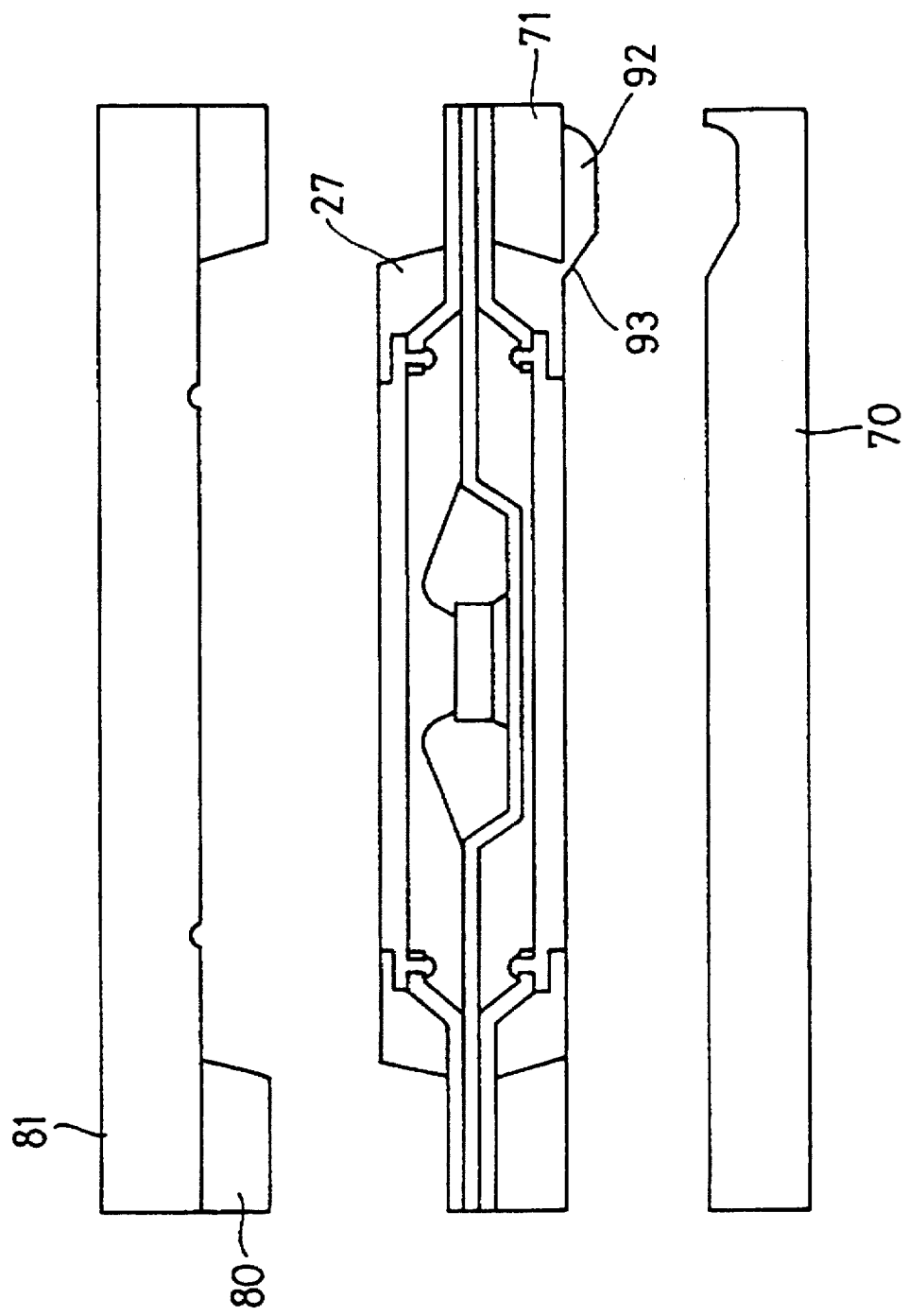
FIG. 23 is a side view of a step of detaching the upper and lower dies from the molded assembly.

After the molding step 53 is completed, as shown in FIG. 23, the upper die 81 is lifted up and detached from the resin package body 27. Then, the lower plate 71 is detached, together with a runner 92, from the lower die 70. FIG. 24 shows the resin package body 27 which is detached, together with the lower plate 71, from the lower die 70.

Figure 25:
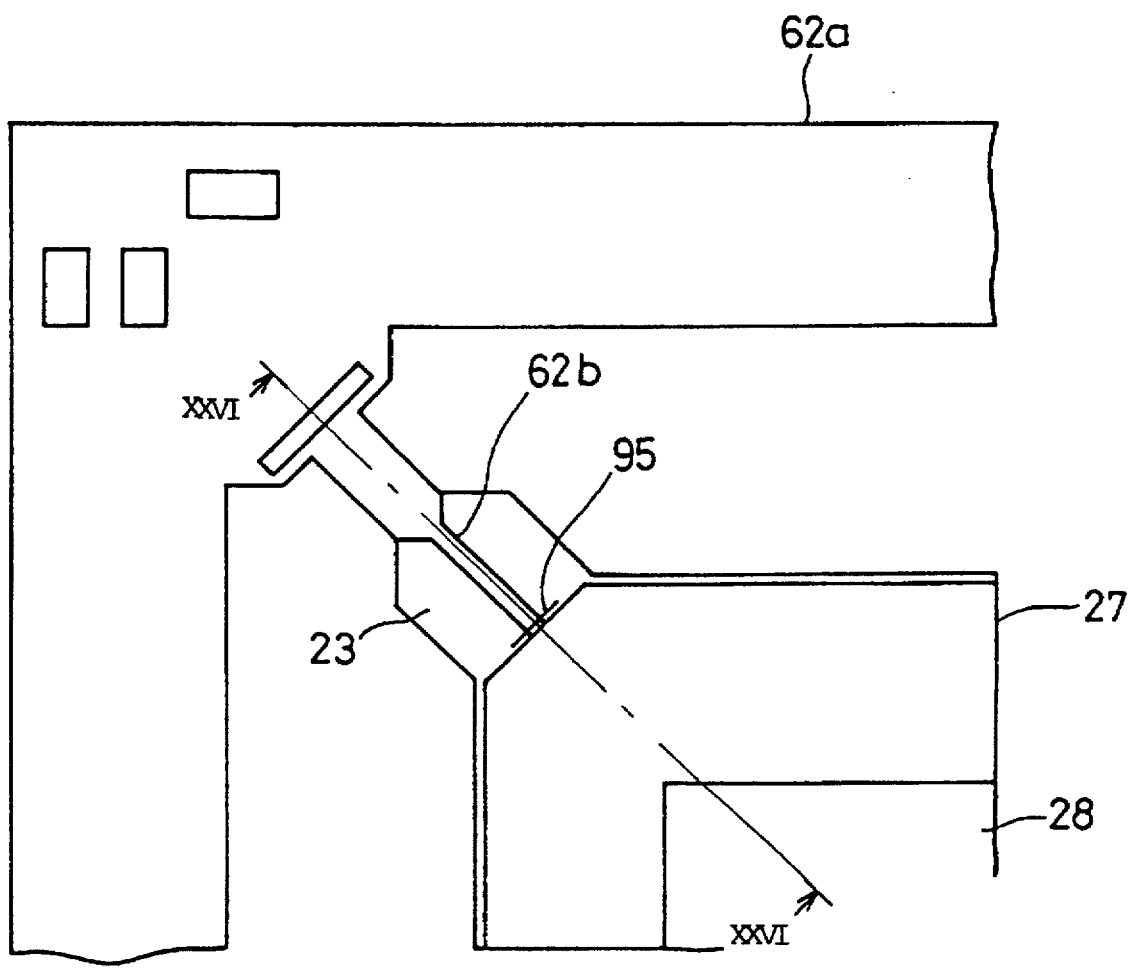
FIG. 25 is a plan view of a state in which the lower plate is removed from the molded assembly.
Figure 26:
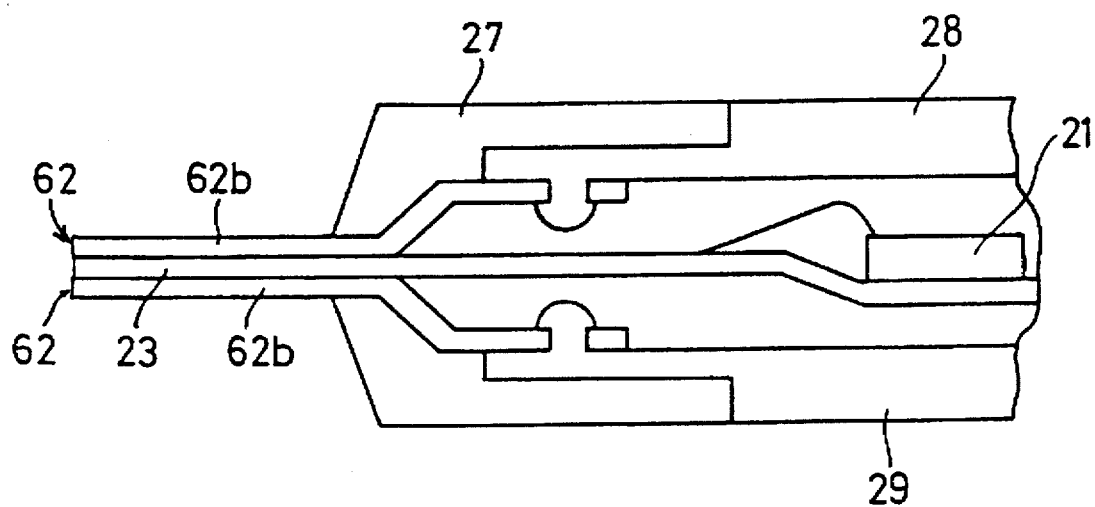
FIG. 26 is a cross-sectional view taken along a line XXVI—XXVI shown in FIG. 25.

Then, the runner 92 is cut at the position of a gate 93 shown in FIG. 23 whereby the resin package body 27 is detached from the lower plate 71 and the assembly shown in FIGS. 25 and 26 is obtained.

Then, step 54 of partially removing the frames 62 shown in FIG. 6 is performed. More particularly, the supporting bars 62b of the upper and lower frames 62 are cut along a line 95 shown in FIG. 25 and outer portions of the supporting bars 62b outside of the resin package body 27 shown in FIG. 26 are removed, as shown in FIG. 28.

Figure 28:
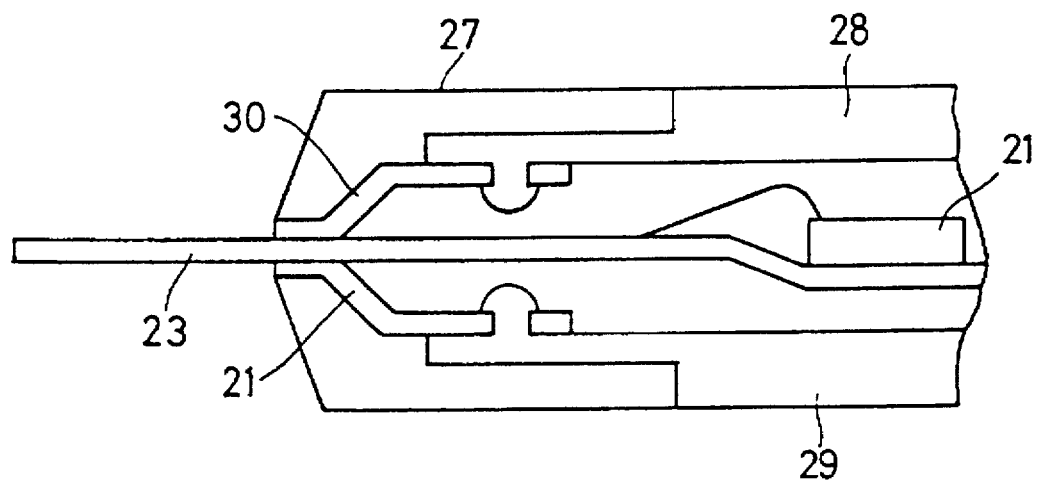
FIG. 28 is a cross-sectional view taken along a line XXVIII—XXVIII shown in FIG. 27.
Figure 27:
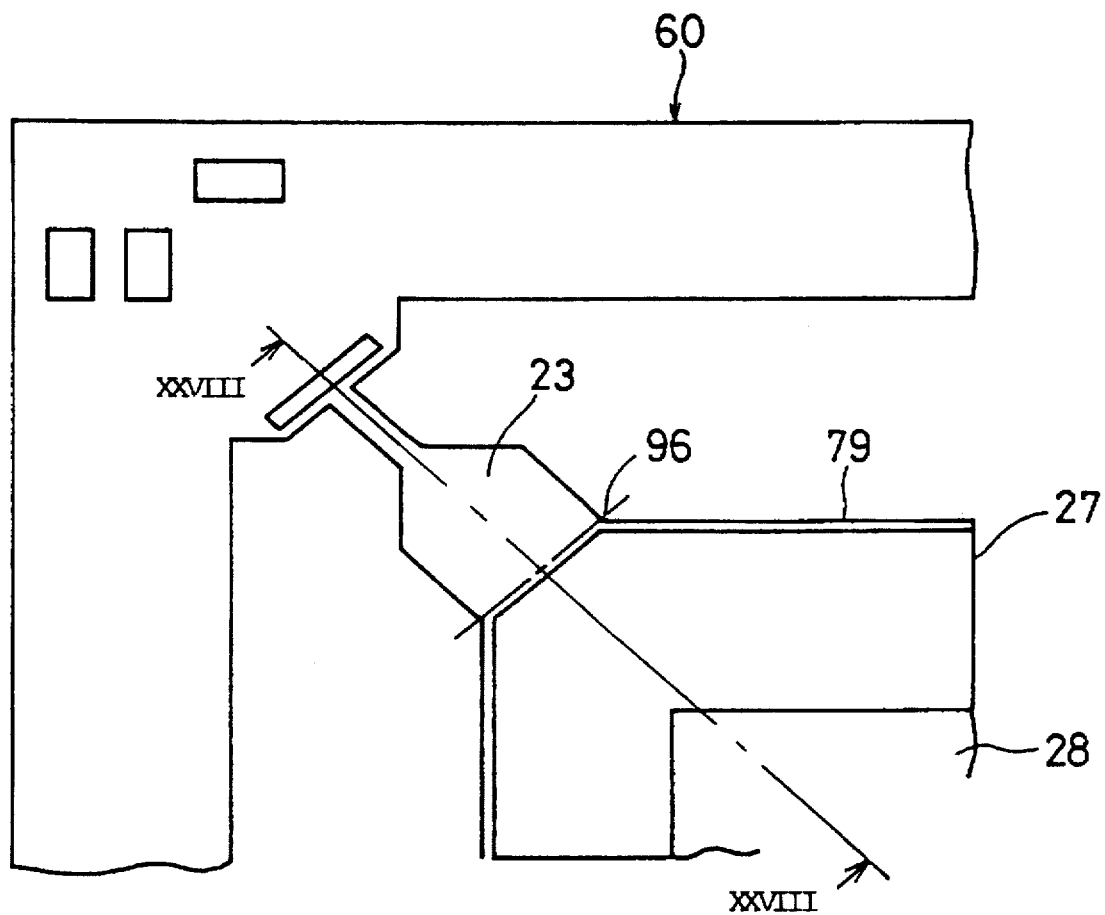
FIG. 27 is a plan view of a state in which the frame used to support the heat radiating plates has been removed.

Then, a solder plating step 55 shown in FIG. 6 is carried out to plate the outer leads 24b with solder in a state in which the heat radiating plates 63 (28, 29) shown in FIGS. 27 and 28 are masked in order to prevent solder from being deposited on the surfaces of the heat radiating plates 63. The heat radiating plates 63 are electrically connected to the lead frame 60 via the supporting bars 30 and 31 and the support bars 23. Hence, solder will be deposited on the surfaces of the heat radiating plates 63 unless these plates are masked by an appropriate member. Further, if imprinting is operated on the solder plating layers formed on the surfaces of the heat radiating plates 63, an imprinted mark or like will disappear in a device mounting process because a temperature applied to the device at the time of the device mounting process melts the solder plating layers. When the heat radiating plates 63 are made of an insulating material, the above masking process is needed.

Thereafter, an imprinting step 56 shown in FIG. 6 is performed to imprint a device number or the like on the heat radiating plate 63 (28).

Finally, a cut/bending step 57 shown in FIG. 6 is carried out. In the step 57, the support bars 23 are cut along line 96 shown in FIG. 27 whereby the device is detached from the lead frame 60. Further, the tie bar 79 is cut in a plurality of positions. Finally, the outer leads 24b are bend, as shown in FIGS. 2 and 3. A reference number 97 shown in FIG. 2 is a mark of the gate 93. In the above-mentioned production process, the semiconductor device 20 shown in FIGS. 2 and 3 can be obtained.

The step 50 does not handle the semiconductor chip 21, and the step 52 only superposes the assemblies 61 and 64. Hence, there is little possibility that a defective part occurs during the steps 50 and 52. The steps 51 and 53–57 are also used in the conventional production process and there is little possibility that a defective part occurs during these steps. As a result, the production method shown in FIG. 6 is capable of producing devices with a high yield.

Figure 29:
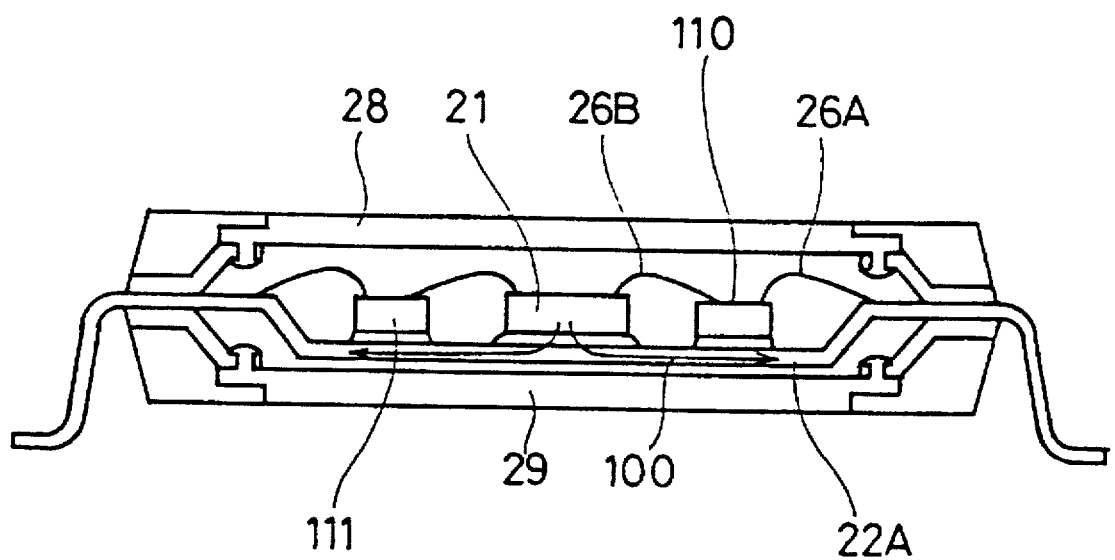
FIG. 29 is a cross-sectional view of a semiconductor integrated circuit device according to another embodiment of the present invention.

FIG. 29 shows a semiconductor integrated circuit device 20A according to another embodiment of the present invention. In FIG. 29, parts that are the same as those shown in the previously described figures are given the same reference numbers as previously.

A stage 22A has a size as large as approximately 10 times that of the semiconductor chip 21. A heat radiating process will now be considered in which heat generated by the semiconductor chip 21 is radiated from the lower side of the semiconductor device 20A. The heat generated by the semiconductor chip 21 is spread in the entire stage 22A as indicated by arrows shown in FIG. 29, and is then spread to the heat radiating plate 29 via which the heat is externally radiated.

Since the size of the stage 22A is much greater than that of the stage 22 shown in FIG. 3, the heat is more widely spread in the stage 22A than that spread in the stage 22. Hence, the heat radiating performance of the semiconductor device 20A is better than that of the semiconductor device 20.

The following matters may be noted due to an increase in the stage size. The distance between the semiconductor chip 21 and the inner leads 24a becomes longer. The bonding wires may be bent easily, as compared with those provided in the semiconductor device 20. Further, a bent bonding wire may come into contact with another bonding wire.

Figure 30:
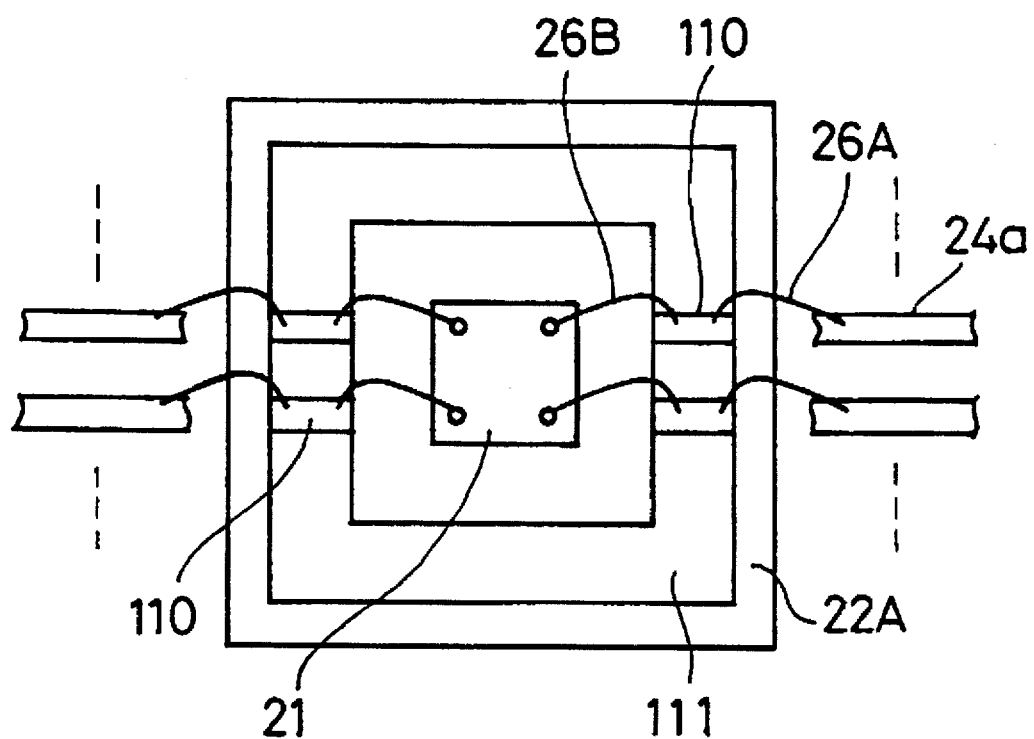
FIG. 30 is a view showing a structure located above the stage.

With the above matters in mind, as shown in FIG. 30, a relay member 111 is fixed on the stage 22A so that the relay member 111 surround the sides of the semiconductor chip 21 via a space. A plurality of terminals 110 like pads are mounted on the upper surface of the relay member 111. Bonding wires 26A connect the outer leads 24a and the pads 110, and bonding wires 26B connect the pads 110 and the pads formed on the semiconductor chip 21.

According to the present invention, the following effects can be obtained.

The heat radiating performance of the present invention is much better than that of the conventional semiconductor device having only the upper heat radiating plate. Hence, according to the present invention, it becomes possible to resin-package a semiconductor chip consuming a large amount of energy such as an MPU. It is to be noted that conventionally, such a semiconductor chip is sealed with a ceramic package. Hence, according to the present invention, it becomes possible to reduce the production cost to 1/5 through 1/10 of the production cost of the device using the ceramic package. Further, when a stage having a size much greater than the size of a semiconductor chip to be packaged, the heat radiating performance is further improved. In this case, use of the relay member eliminates a possibility that wires are bent or shortcircuited because the wires relaying the relay member can be shortened. Furthermore, the semiconductor device according to the present invention can be produced without a complex step, so that a good yield can be achieved.

The present invention is not limited to the specifically disclosed embodiments, and variations and modifications may be made without departing from the scope of the present invention.

What is claimed is:

1. A semiconductor integrated circuit device comprising:

a semiconductor chip supported by a stage;

leads electrically connected to the semiconductor chip;

first and second heat radiating members provided on first and second sides of the semiconductor chip;

heat conducting supporting members, supporting the first and second heat radiating members away from the stage; and a resin package body completely sealing the semiconductor chip and partially sealing the leads and the first and second heat radiating members.

2. The semiconductor integrated circuit device as claimed in claim 1, wherein the first and second sides of the semiconductor device oppose each other.

3. The semiconductor integrated circuit device as claimed in claim 1, wherein each of the first and second heat radiating members has a plate shape.

4. The semiconductor integrated circuit device as claimed in claim 1, wherein a space between the first heat radiating member and the first side of the semiconductor chip is filled with resin of the resin package body, and a space between the second heat radiating member and the second side of the semiconductor chip is filled with resin of the resin package body.

5. The semiconductor integrated circuit device as claimed in claim 1, wherein the supporting members includes upper supporting members provided on the side of the first heat radiating member and lower supporting members provided on the side of the second heat radiating member.

6. A semiconductor integrated circuit device comprising:

a semiconductor chip supported by a stage;

leads electrically connected to the semiconductor chip;

first and second heat radiating members provided on first and second sides of the semiconductor chip;

a resin package body completely sealing the semiconductor chip and partially sealing the leads and the first and second heat radiating members; and supporting members supporting the first and second heat radiating members from the stage;

wherein the supporting members include upper supporting members provided on the side of the first heat radiating member and lower supporting members provided on the side of the second heat radiating member; and wherein the stage and the lower supporting members are integrally formed.

7. The semiconductor integrated circuit device as claimed in claim 1, wherein a surface of the first heat radiating member is externally exposed, and a surface of the second heat radiating member is externally exposed.

8. The semiconductor integrated circuit device as claimed in claim 1, wherein the stage has a length greater than that of the semiconductor chip.

9. A semiconductor integrated circuit device comprising:

a semiconductor chip supported by a stage;

leads electrically connected to the semiconductor chip;

first and second heat radiating members provided on first and second sides of the semiconductor chip;

a resin package body completely sealing the semiconductor chip and partially sealing the leads and the first and second heat radiating members; and a relay member having terminals, and wherein the leads are electrically connected to the semiconductor chip via the terminals of the relay member.

10. The semiconductor integrated circuit device as claimed in claim 9, wherein the relay member is mounted on the stage so that the relay member surrounds sides of the semiconductor chip.

11. The semiconductor integrated circuit device as claimed in claim 9, further comprising first wires connecting the leads to the terminals of the relay member and second wires connecting the terminals to the semiconductor chip.

12. The semiconductor integrated circuit device as claimed in claim 1, wherein said supporting members include calk members.

13. The semiconductor integrated circuit device of claim 1, wherein said heat conducting supporting members are supporting bars.

14. The semiconductor integrated circuit device of claim 1, wherein said heat conducting supporting members are made of metal.

15. The semiconductor integrated circuit device of claim 14, wherein said heat conducting supporting members include Ni-Fe.

* * * * *

UNITED STATES PATENT AND TRADEMARK OFFICE
CERTIFICATE OF CORRECTION

PATENT NO.: 5,703,398
DATED : December 30, 1997
INVENTOR(S): SONO et al.

It is certified that an error appears in the above-identified patent and that said Letters Patent is hereby corrected as shown below:

On the title page:

In item [73] the assignee, one of the assignees has been omitted. Please change "Fujitsu Limited, Kawasaki, Japan " to be --Fujitsu Limited and Fujitsu Automation Limited, both of Kawasaki, Japan-- therefor.

Signed and Sealed this

Seventh Day of July, 1998

Attest:

BRUCE LEHMAN

*Attesting Officer*        *Commissioner of Patents and Trademarks*